(12) United States Patent
Dunwoody et al.

(10) Patent No.: US 9,380,728 B1
(45) Date of Patent: Jun. 28, 2016

(54) CONFIGURABLE DRAWER-BASED COMPUTING SYSTEM AND RELATED METHODS

(71) Applicant: Birchbridge Incorporated, Belmont, CA (US)

(72) Inventors: John Craig Dunwoody, Belmont, CA (US); Teresa Ann Dunwoody, Belmont, CA (US)

(73) Assignee: Birchbridge Incorporated, Belmont, CA (US)

( * ) Notice: Subject to any disclaimer, the term of this patent is extended or adjusted under 35 U.S.C. 154(b) by 0 days.

(21) Appl. No.: 14/586,604

(22) Filed: Dec. 30, 2014

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *H05K 7/14* | (2006.01) |

(52) U.S. Cl.
CPC ............ *H05K 7/1489* (2013.01); *H05K 7/1491* (2013.01); *H05K 7/1492* (2013.01); *H05K 7/20736* (2013.01); *H05K 7/20781* (2013.01)

(58) Field of Classification Search
CPC . H05K 7/20; H05K 7/20136; H05K 7/20209; H05K 7/14; H05K 7/1421
USPC ............ 361/724–727, 679.48, 679.49, 679.5, 361/679.51, 679.46; 312/223.1, 223.2, 312/223.3
See application file for complete search history.

(56) References Cited

U.S. PATENT DOCUMENTS

| | | | | |
|---|---|---|---|---|
| 6,164,369 | A * | 12/2000 | Stoller | H05K 7/206 165/104.33 |
| 6,310,783 | B1 * | 10/2001 | Winch | H01M 2/1077 361/679.02 |
| 6,331,933 | B1 * | 12/2001 | Rumney | G06F 1/184 174/541 |
| 7,200,008 | B1 * | 4/2007 | Bhugra | G11B 25/043 361/679.21 |
| 7,457,112 | B2 * | 11/2008 | Fukuda | G11B 33/022 361/679.48 |
| 8,081,441 | B2 * | 12/2011 | Zhang | G11B 33/128 361/679.32 |
| 8,498,309 | B2 * | 7/2013 | Campini | H05K 7/1461 361/725 |
| 9,019,706 | B2 * | 4/2015 | Ning | H05K 7/1492 312/223.2 |
| 2003/0030991 | A1 * | 2/2003 | Riddiford | G06F 1/183 361/724 |
| 2005/0168934 | A1 * | 8/2005 | Wendel | G11B 33/128 361/679.36 |
| 2010/0208433 | A1 * | 8/2010 | Heimann | H04Q 1/10 361/724 |
| 2013/0155599 | A1 * | 6/2013 | Ross | G06F 1/187 361/679.31 |

\* cited by examiner

*Primary Examiner* — Anthony Haughton
(74) *Attorney, Agent, or Firm* — Alston & Bird LLP

(57) ABSTRACT

Systems and methods providing for packaging of scalable machines are discussed herein. Some embodiments may include a configurable drawer-based computing system that includes a frame configured to hold drawer modules that may each be slidably inserted into or pulled out from the frame. The system may provide power, networking, and cooling to the drawer modules, even while a drawer module has been pulled out for purposes such as system maintenance. Each drawer module may include printed circuit board assemblies and other components. The system may provide for configurability in the mounting of the drawer modules such that slidable modules that differ in function and/or size may be combined with minimal wasted space within the frame.

23 Claims, 12 Drawing Sheets
(10 of 12 Drawing Sheet(s) Filed in Color)

CONFIGURABLE DRAWER-BASED COMPUTING SYSTEM AND RELATED METHODS

FIELD

Embodiments of the invention relate, generally, to packaging for scalable machines.

BACKGROUND

Circuitry can be configured to provide data networking, processing, storage, and/or other types of functionality. Often, such circuitry, sometimes referred to herein as "computing components", or simply "components," is installed in computing racks that supply packaging, power, networking and cooling to the computing components. The design of rack based computing systems may require various tradeoffs in areas such as space efficiency (e.g., usable networking, processing, and/or storage capacity per unit of volume and/or floor area occupied by a computing rack), energy efficiency, cost, scalability, and serviceability. In this regard, areas for improving current systems have been identified.

BRIEF SUMMARY

Through applied effort, ingenuity, and innovation, solutions to improve packaging of scalable machines that may perform data-related functions and/or other types of functions, have been realized and are described herein. More specifically, an alternative packaging approach for such machines has been identified. This alternative packaging approach may be superior in areas such as space efficiency (e.g., quantity of usable data networking, processing, storage, and/or other functional capacity per unit of volume and/or floor area); energy efficiency; manufacturing cost; scalability; and serviceability. In accordance with this alternative packaging approach, systems and methods providing for packaging of scalable machines are discussed herein. The packaging may be referred to herein as a configurable drawer-based computing system.

In some embodiments, the configurable drawer-based computing system may include: a frame defining an interior region and exterior sides including an open front side; a plurality of module support mounting rails connected with the frame; and a plurality of drawer units, each drawer unit comprising a drawer module support and a drawer module. The plurality of drawer units may comprise a plurality of drawer module supports and a plurality of drawer modules. Each drawer module support may be disposed within the interior region of the frame and connected with the plurality of module support mounting rails. Each drawer module support may be configured to receive a drawer module from the open front side.

Each drawer module may include: a heat transfer grid defining a first cooling plane and a second cooling plane opposite to the first cooling plane, each of the first cooling plane and second cooling plane defining one or more external heat exchange interface regions; one or more first printed circuit board assemblies (PCBAs) coupled thermally with the first cooling plane; one or more second PCBAs coupled thermally with the second cooling plane; one or more first cooling rails coupled thermally with the first cooling plane at an external heat exchange interface of the first cooling plane; one or more second cooling rails coupled thermally with the second cooling plane at an external heat exchange interface of the second cooling plane; and one or more slide components secured with the heat transfer grid, each slide component configured to slidably engage a drawer module support.

In some embodiments, each slide component may be configured to slidably engage a drawer module support such that the drawer module can be slidably inserted within the interior region of the frame and pulled out from the interior region at the open front side of the frame.

In some embodiments, each of the first cooling plane and second cooling plane may define one or more component interface regions. The one or more first PCBAs may be coupled thermally with the first cooling plane at a component interface region of the first cooling plane. The one or more second PCBAs may be coupled thermally with the second cooling plane at a component interface region of the second cooling plane. The heat transfer grid may facilitate heat flow from the component interface region of the first cooling plane to the external heat exchange interface region first cooling plane and from the component interface region of the second cooling plane to the external heat exchange interface region of the second cooling plane.

In some embodiments, the system may further include: one or more frame power distribution units connected with the plurality of drawer modules via frame power cables, the one or more frame power distribution units configured to supply frame power to the plurality of drawer modules via the frame power cables; one or more frame data cable managers connected with the plurality of drawer modules via frame data cables, the one or more frame data cable managers configured to supply data communication to the plurality of drawer modules via the frame data cables; one or more frame cooling fluid supply manifolds connected with the plurality of drawer modules via frame cooling fluid supply tubes, the one or more frame cooling fluid supply manifolds configured to supply cooled frame cooling fluid to the cooling rails of the plurality of drawer modules via the frame cooling fluid supply tubes; and one or more frame cooling fluid return manifolds connected with the plurality of drawer modules via frame cooling fluid return tubes, the one or more frame cooling fluid return manifolds configured to receive heated frame cooling fluid from the cooling rails of the plurality of drawer modules via the frame cooling fluid return tubes.

In some embodiments, each of the plurality of drawer modules may further include a guide arm attached to a drawer module support at a first end and attached to the heat transfer grid at a second end. The guide arm may secure one or more frame power cables, one or more frame data cables, one or more frame cooling fluid supply tubes, and one or more frame cooling fluid return tubes connected with the drawer module.

In some embodiments, each guide arm may include: a first portion secured with the one or more frame power cables, the one or more frame data cables, the one or more frame cooling fluid supply tubes, and the one or more frame cooling fluid return tubes; a second portion secured with the one or more frame power cables, the one or more frame data cables, the one or more frame cooling fluid supply tubes, and the one or more frame cooling fluid return tubes; and a joint connecting the first portion and the second portion, wherein the first portion and second portion bend with respect to each other via the joint. Each guide arm may be configured to: bend at the joint when the drawer module is inserted within the interior region of the frame; and unbend at the joint when the drawer module is pulled out of the interior region.

In some embodiments, each of the plurality of drawer modules may be slidably pulled out of the interior region, and (e.g., subsequently) reinserted within the interior region, without disconnecting, reconnecting, or otherwise manipulating any of the one or more frame power cables, frame data cables, frame cooling fluid supply tubes, or frame cooling fluid return tubes connected with the drawer module.

In some embodiments, each of the plurality of drawer modules may further include one or more drawer power PCBAs disposed on the first cooling plane of the heat transfer grid. Each drawer power PCBA may be connected with one or more frame power distribution units via one or more frame power cables, and configured to supply drawer power to the one or more first PCBAs.

In some embodiments, each of the plurality of drawer modules may further include one or more drawer network PCBAs disposed on the first cooling plane of the heat transfer grid. Each drawer network PCBA may be connected with one or more frame data cable managers via one or more frame data cables, and configured to supply data communication to the one or more first PCBAs.

In some embodiments, the plurality of drawer module supports may be adjustably connected with the module support mounting rails such that each drawer module support can be disposed at one of multiple mounting locations along a length dimension of the plurality of module support mounting rails.

In some embodiments, each of the plurality of drawer units may occupy exclusively a physical space, such that the size of this space projected as a distance along a length dimension of the plurality of module support mounting rails, may be an integer multiple of a common unit of mounting distance ("pitch").

In some embodiments, the system may further include one or more frame power units, each configured to supply frame power to the plurality of drawer modules via one or more frame power distribution units. Each frame power unit may include: a frame power module support disposed within the interior region of the frame and connected with the plurality of module support mounting rails, the frame power module support configured to receive one or more frame power modules; and one or more frame power modules secured with the frame power module support, each frame power module configured to receive facility power from a facility power source and supply the frame power to the one or more frame power distribution units.

In some embodiments, the frame power module support may include a backplane including one or more backplane blind-mate connectors configured to mate with corresponding module blind-mate connectors on the one or more frame power modules when the one or more frame power modules is secured with the frame power module support.

In some embodiments, the system may further include one or more frame heat transfer units, each configured to supply cooled frame cooling fluid to the cooling rails of the plurality of drawer modules, and receive heated frame cooling fluid from the cooling rails of the plurality of drawer modules, via one or more frame cooling fluid supply manifolds and one or more frame cooling fluid return manifolds. Each frame heat transfer unit may include: a frame heat transfer module support disposed within the interior region of the frame and connected with the plurality of module support mounting rails, the frame heat transfer module support configured to receive one or more frame heat transfer modules; and one or more frame heat transfer modules secured with the frame heat transfer module support, each frame heat transfer module connected with facility cooling fluid supply tubing and facility cooling fluid return tubing, and further connected with the one or more frame cooling fluid supply manifolds and the one or more frame cooling fluid return manifolds. Each frame heat transfer module may be configured to: receive cooled facility cooling fluid from the facility cooling fluid supply tubing; receive the heated frame cooling fluid from the one or more frame cooling fluid return manifolds; cool the received heated frame cooling fluid via transfer of heat to the received facility cooling fluid; supply the cooled frame cooling fluid to the one or more frame cooling fluid supply manifolds; and return the heated facility cooling fluid to the facility cooling fluid return tubing.

In some embodiments, the frame heat transfer module support may include a backplane including one or more backplane blind-mate connectors configured to mate with corresponding module blind-mate connectors on the one or more frame heat transfer modules when the one or more frame heat transfer modules is secured with the frame heat transfer module support.

In some embodiments, the system may further include one or more rackmount module supports. Each rackmount module support may be disposed within the interior region of the frame and connected with the plurality of module support mounting rails. The rackmount module support may include module mounts configured to connect with one or more standard rackmount modules.

In some embodiments, the system may further include: one or more exhaust fan modules configured to supply forced-convection cooling air flow from within the interior region of the frame to a top exterior side of the frame; and one or more air-to-fluid heat exchanger modules mounted adjacent to the one or more exhaust fan modules, the one or more air-to-fluid heat exchanger modules configured to remove heat from the cooling air flow within the interior region of the frame.

Some embodiments may provide for a method of managing a configurable drawer-based computing system. The method may include: disposing a drawer module support within an interior region defined by a frame of the configurable drawer-based computing system; slidably connecting a drawer module with the drawer module support via an open front side defined by the frame; connecting a drawer power PCBA of the drawer module with a frame power distribution unit via one or more frame power cables; connecting at least one of a drawer network PCBA or a databoard PCBA of the drawer module with a frame data cable manager via one or more frame data cables; connecting cooling rails of the drawer module with a frame cooling fluid supply manifold via one or more frame cooling fluid supply tubes; connecting the cooling rails of the drawer module with a frame cooling fluid return manifold via one or more frame cooling fluid return tubes; securing the one or more frame power cables, the one or more frame data cables, the one or more frame cooling fluid supply tubes, and the one or more frame cooling fluid return tubes with a guide arm of the drawer module; and subsequent to securing the one or more frame power cables, the one or more frame data cables, the one or more frame cooling fluid supply tubes, and the one or more frame cooling fluid return tubes with the guide arm, fully inserting the drawer module within the drawer module support to the interior region defined by the frame.

In some embodiments, the method may further include, without disconnecting connections of the one or more frame power cables, the one or more frame data cables, the one or more frame cooling fluid supply tubes, or the one or more frame cooling fluid return tubes, at least partially sliding the drawer module out from the interior region from the front side defined by the frame.

In some embodiments, at least partially sliding the drawer module out from the interior region may include unbending the guide arm and the one or more frame power cables, the one or more frame data cables, the one or more frame cooling fluid supply tubes, and the one or more frame cooling fluid return tubes secured with the guide arm.

In some embodiments, fully inserting the drawer module within the drawer module support to the interior region may include bending the guide arm and the one or more frame power cables, the one or more frame data cables, the one or more frame cooling fluid supply tubes, and the one or more frame cooling fluid return tubes secured with the guide arm.

In some embodiments, disposing the drawer module support within an interior region of the frame may include connecting the drawer module support with a plurality of module support mounting rails at a location along a length dimension of the plurality of module support mounting rails, such that the drawer module support may be adjustably connected at the location with the plurality of module support mounting rails.

In some embodiments, slidably connecting the drawer module with the drawer module support may include interfacing slide components of the drawer module with the drawer module support.

These characteristics, as well as additional features, functions, and details of various corresponding and additional embodiments, are also described below.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Figure 1:
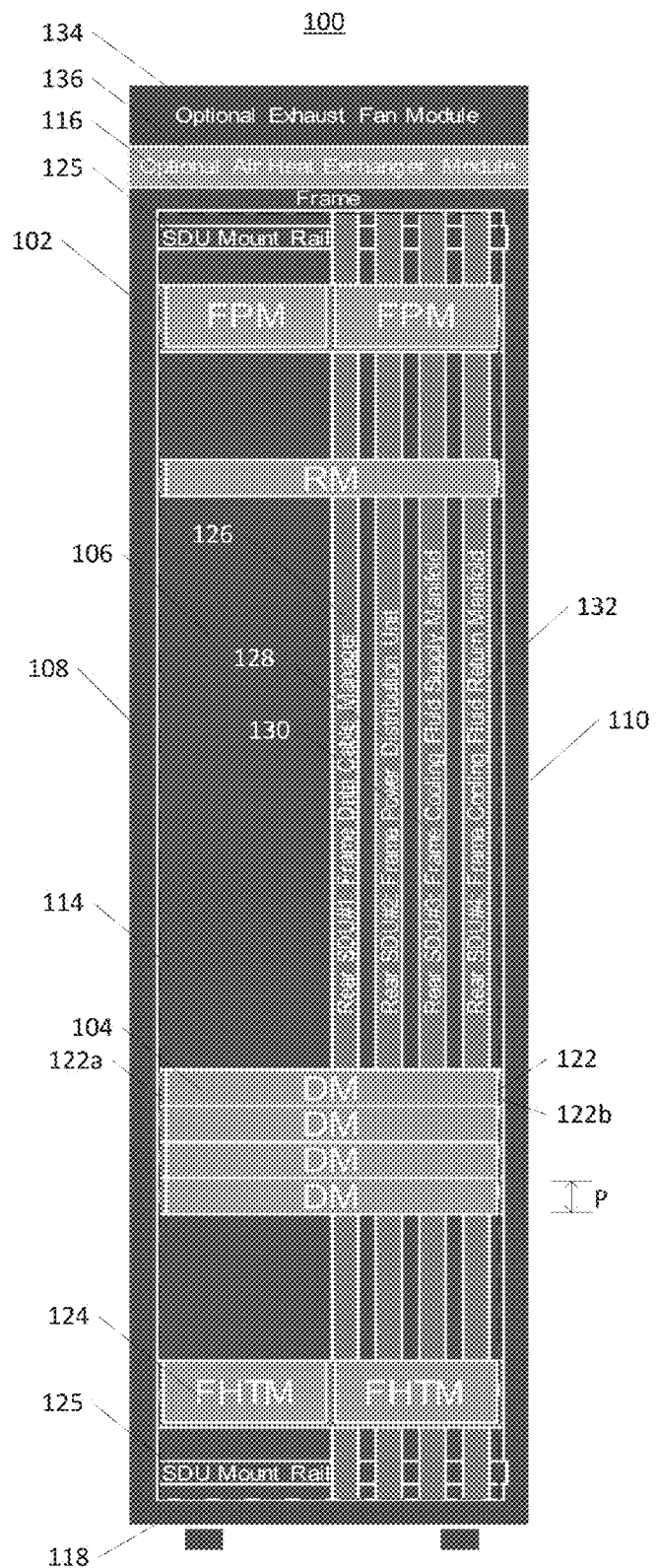
Figure 2:
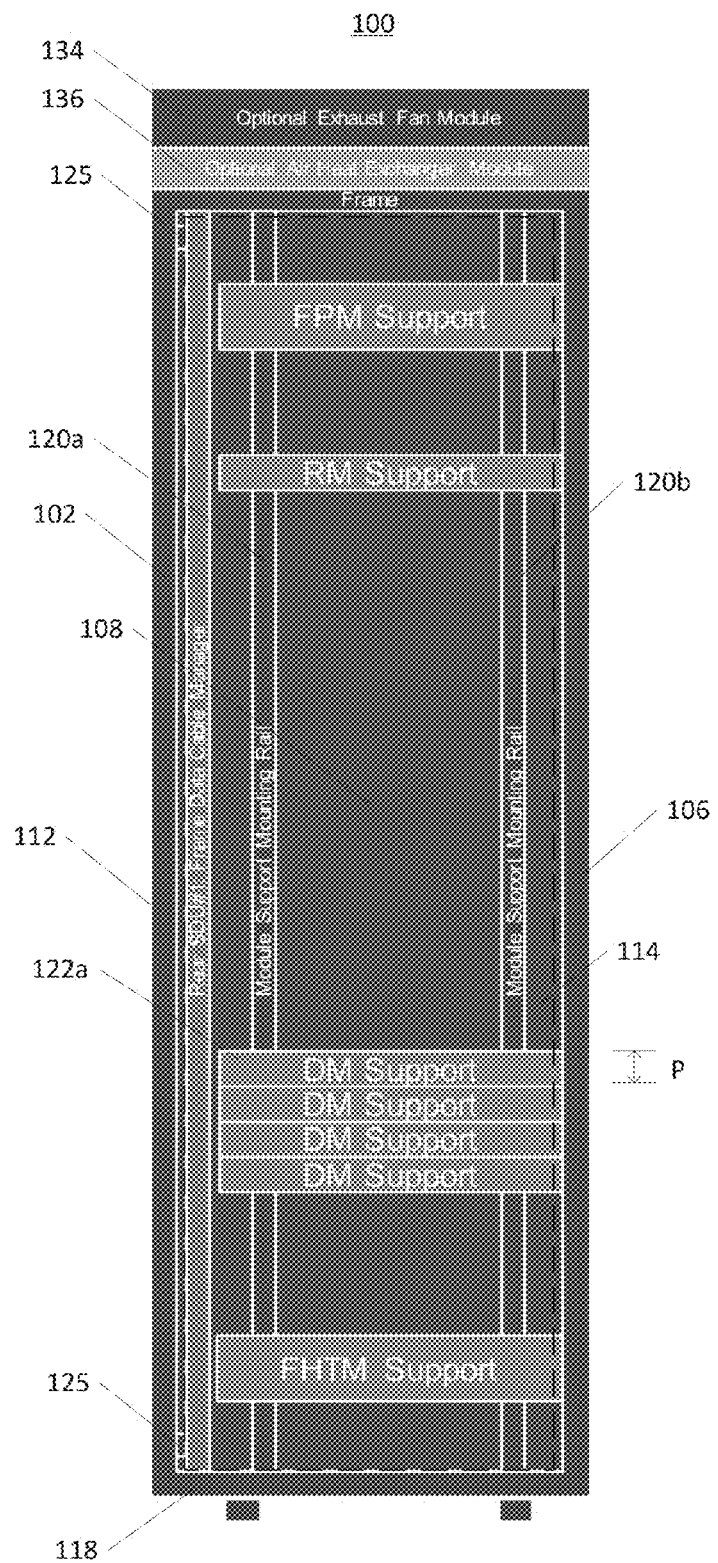
Figure 3:
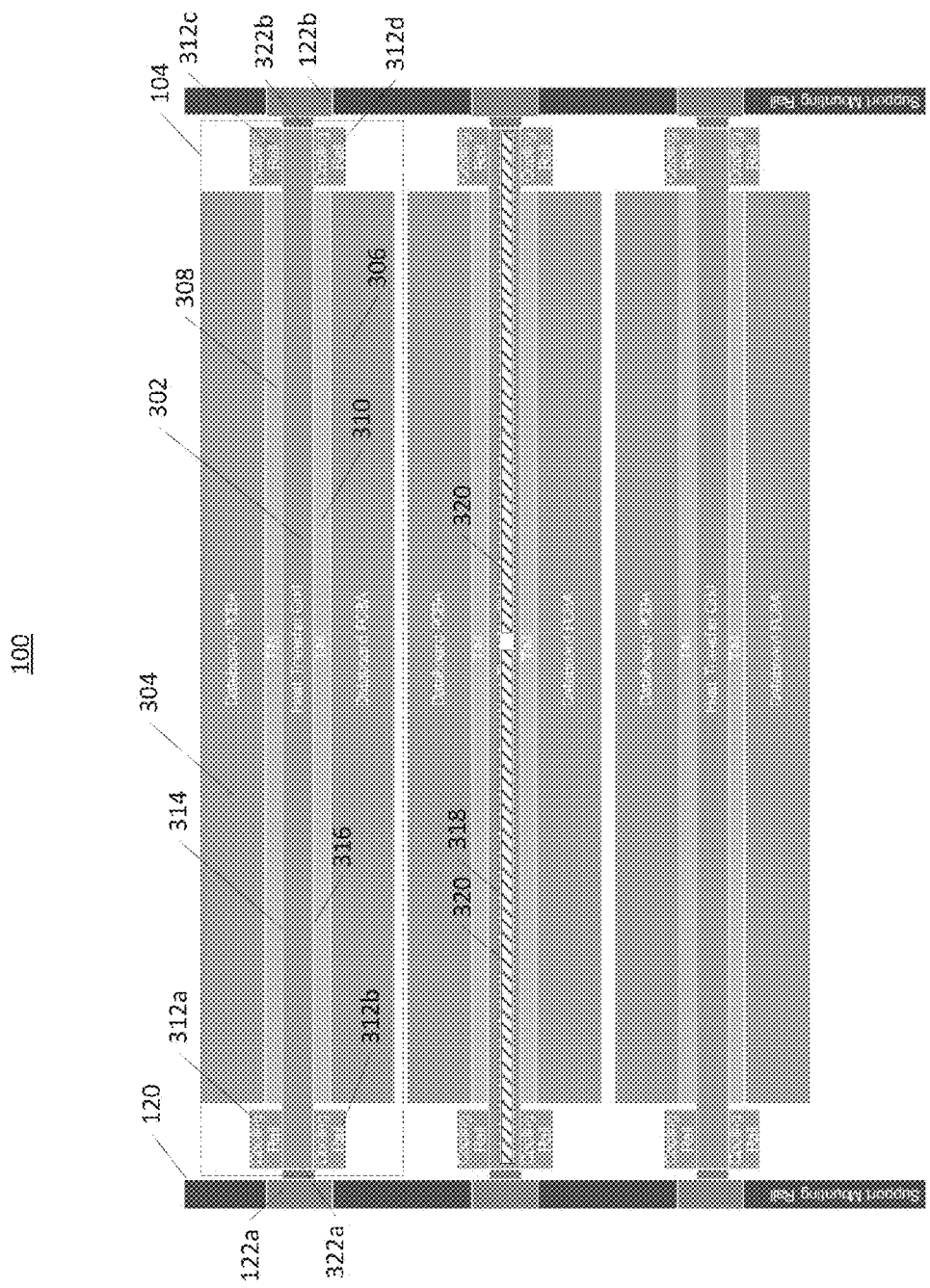
Figure 4A:
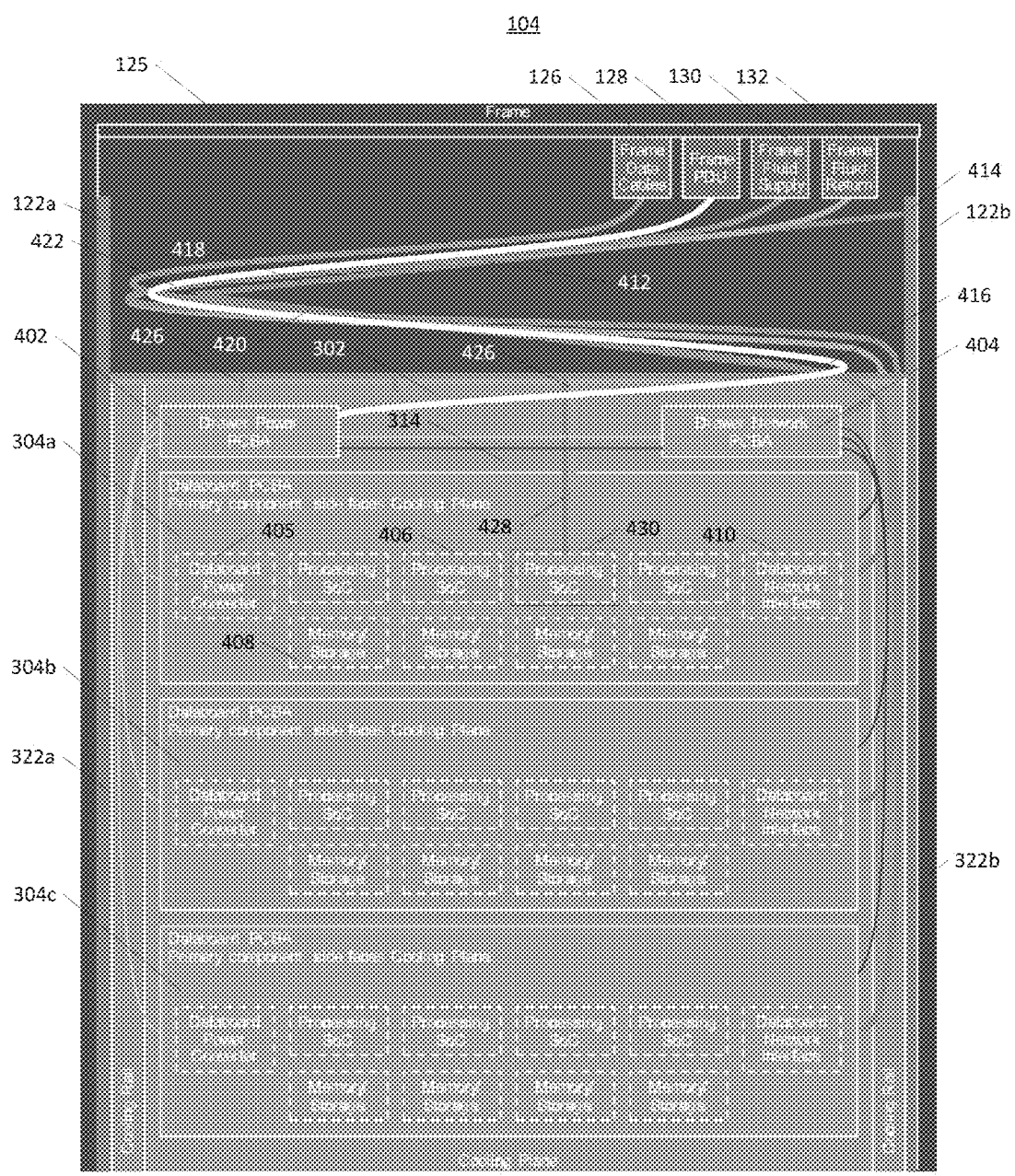
Figure 4B:
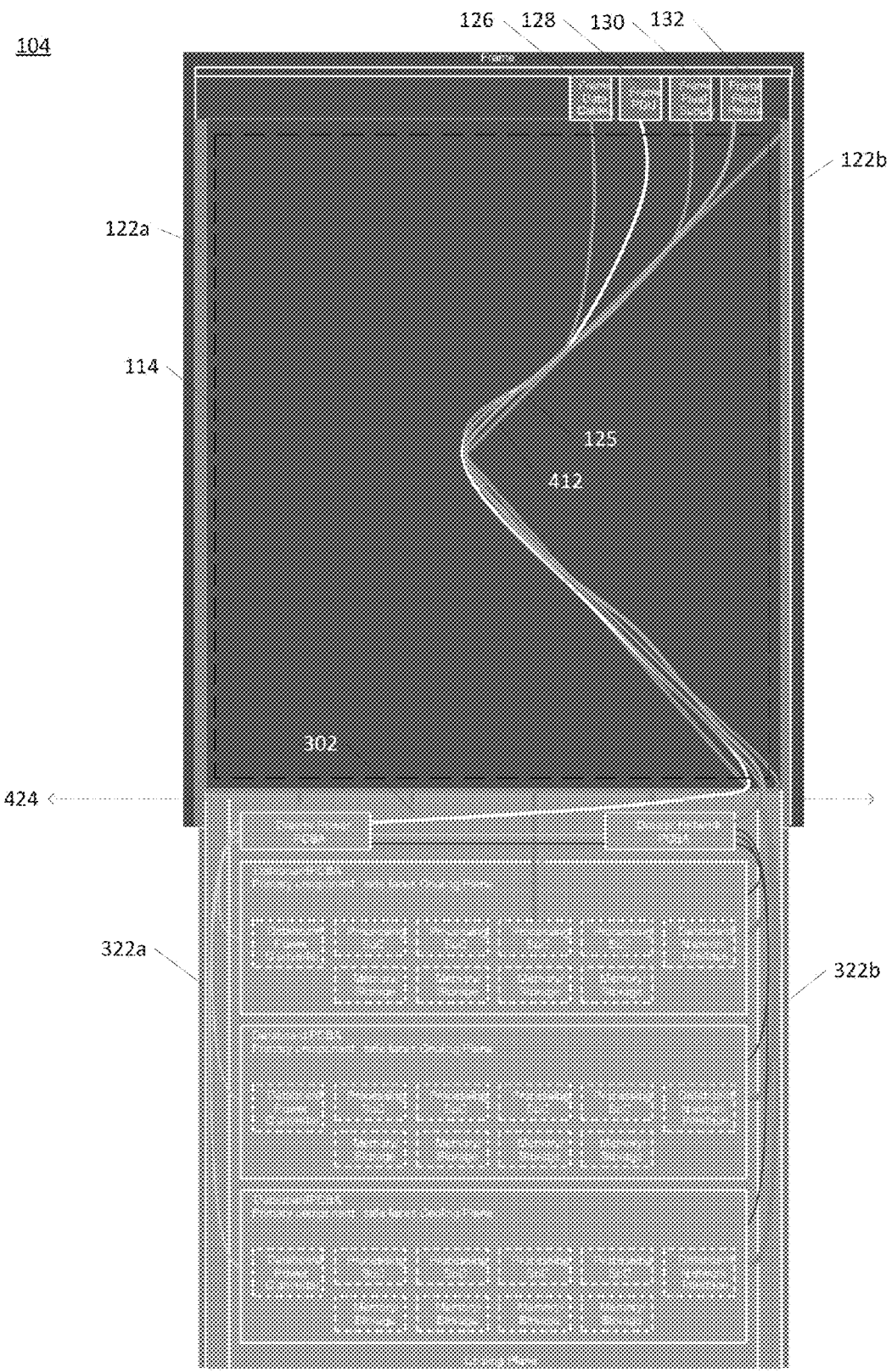
Figure 5A:
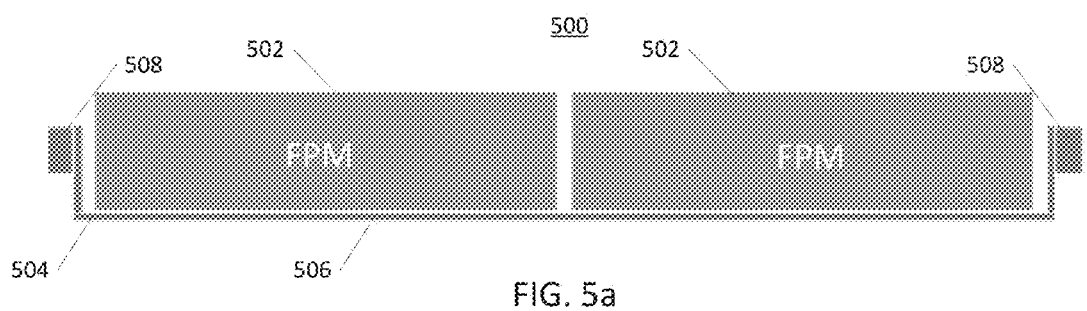
Figure 5B:
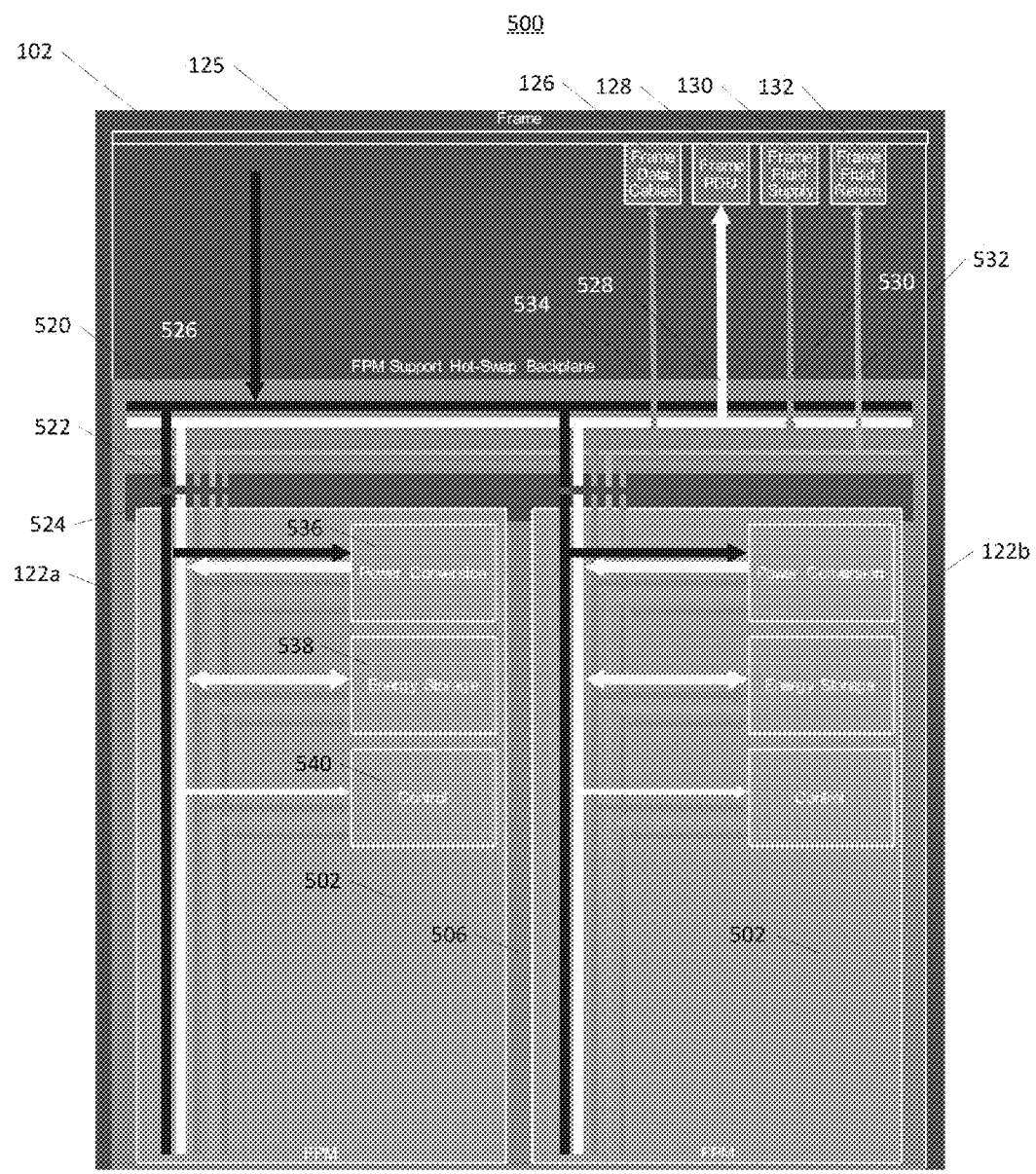
Figure 6:
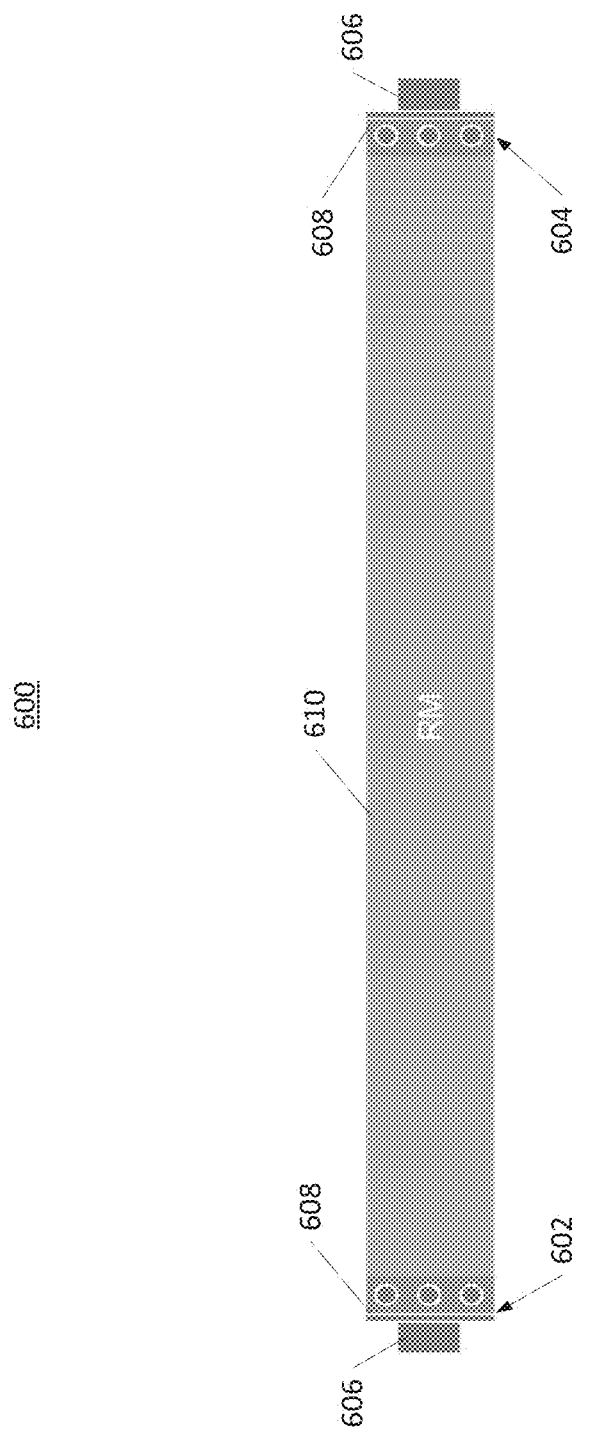
Figure 7A:
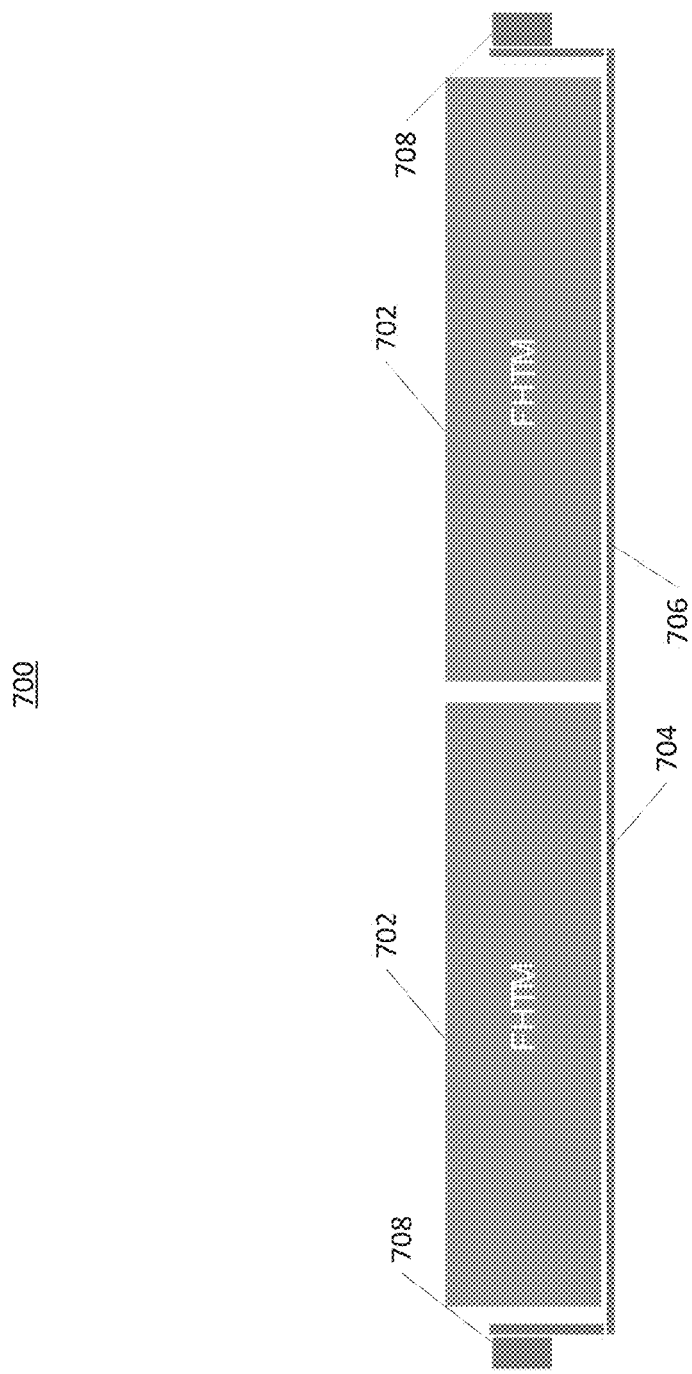
Figure 7B:
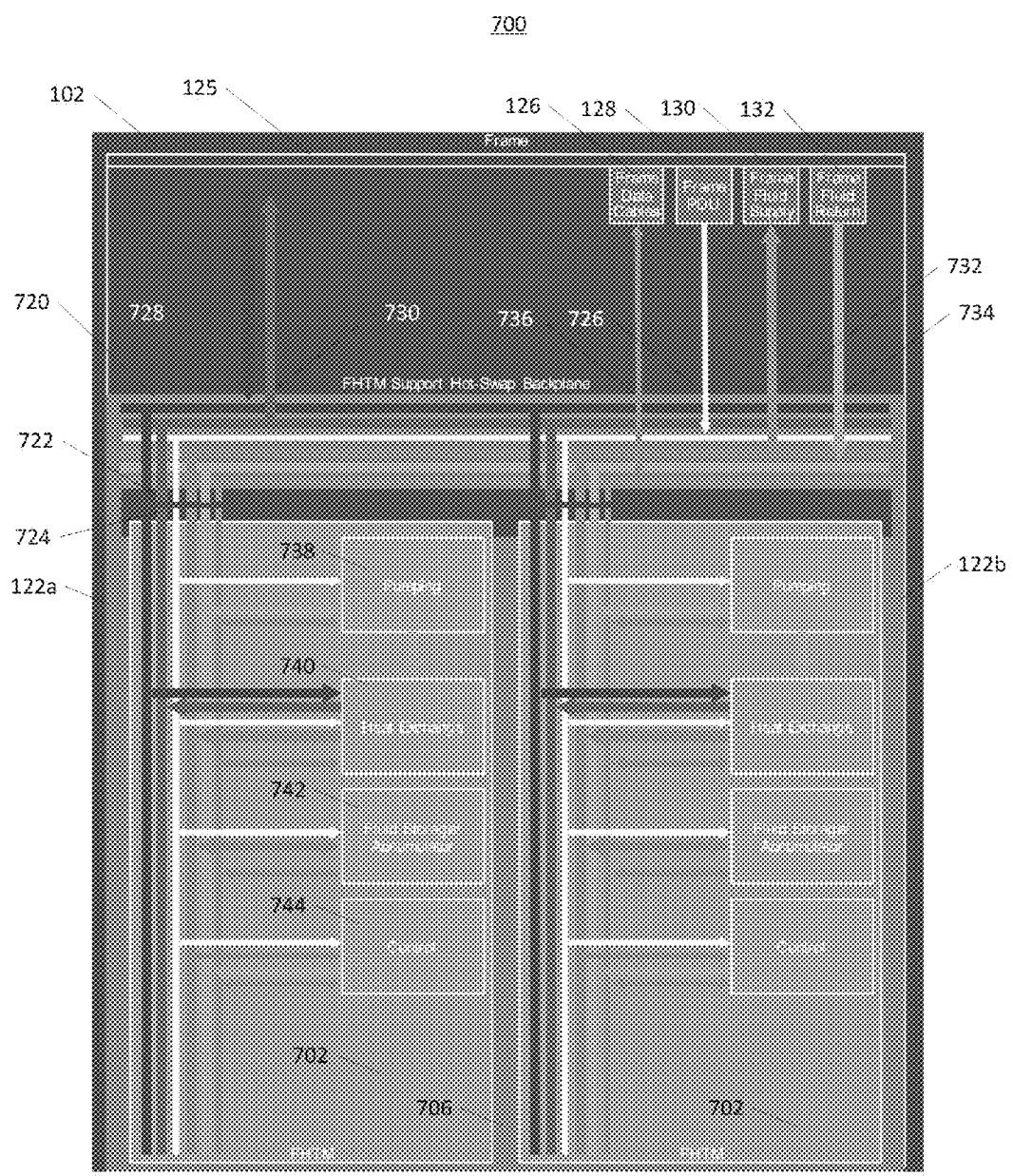
Figure 8:
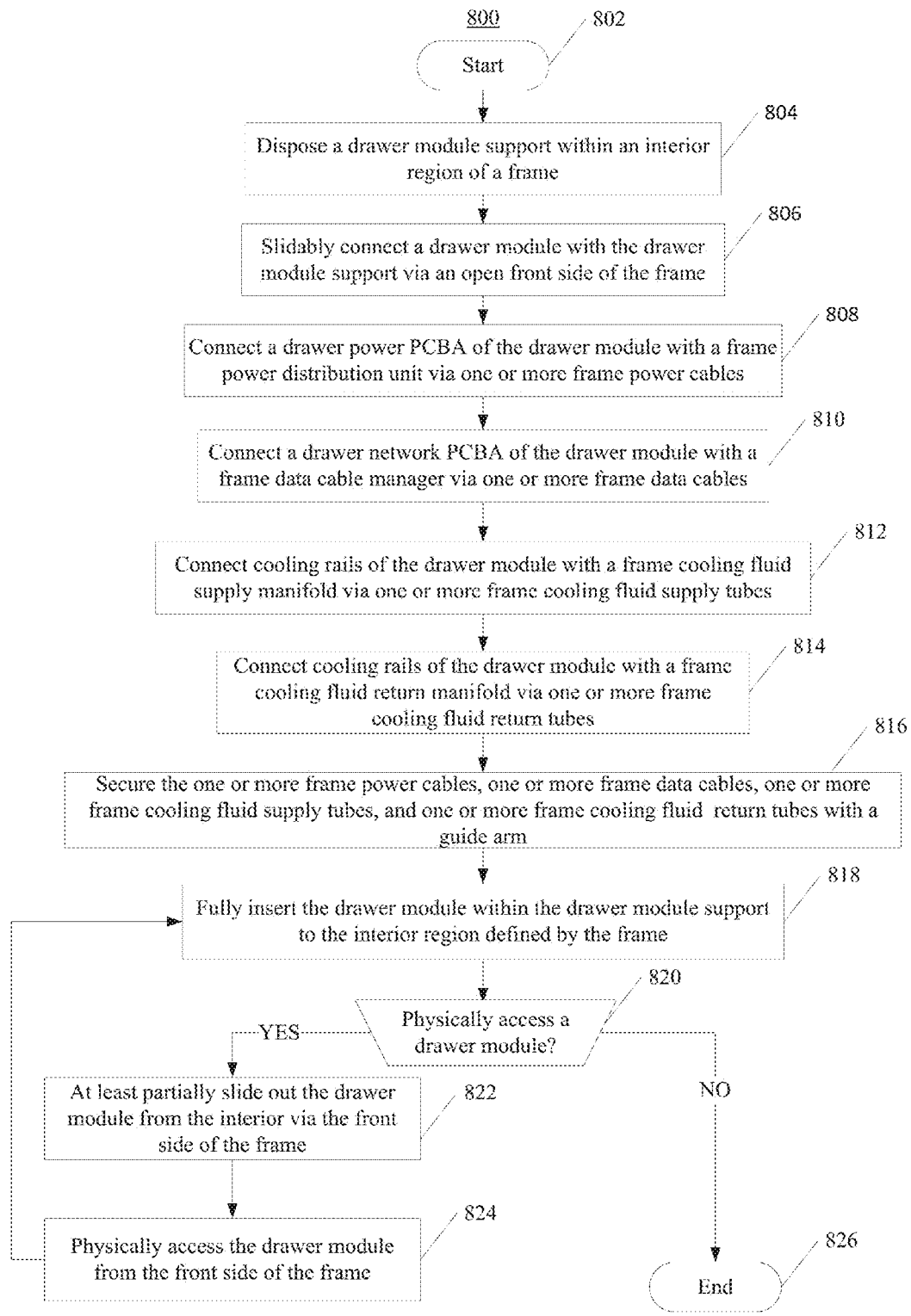
Figure 9:
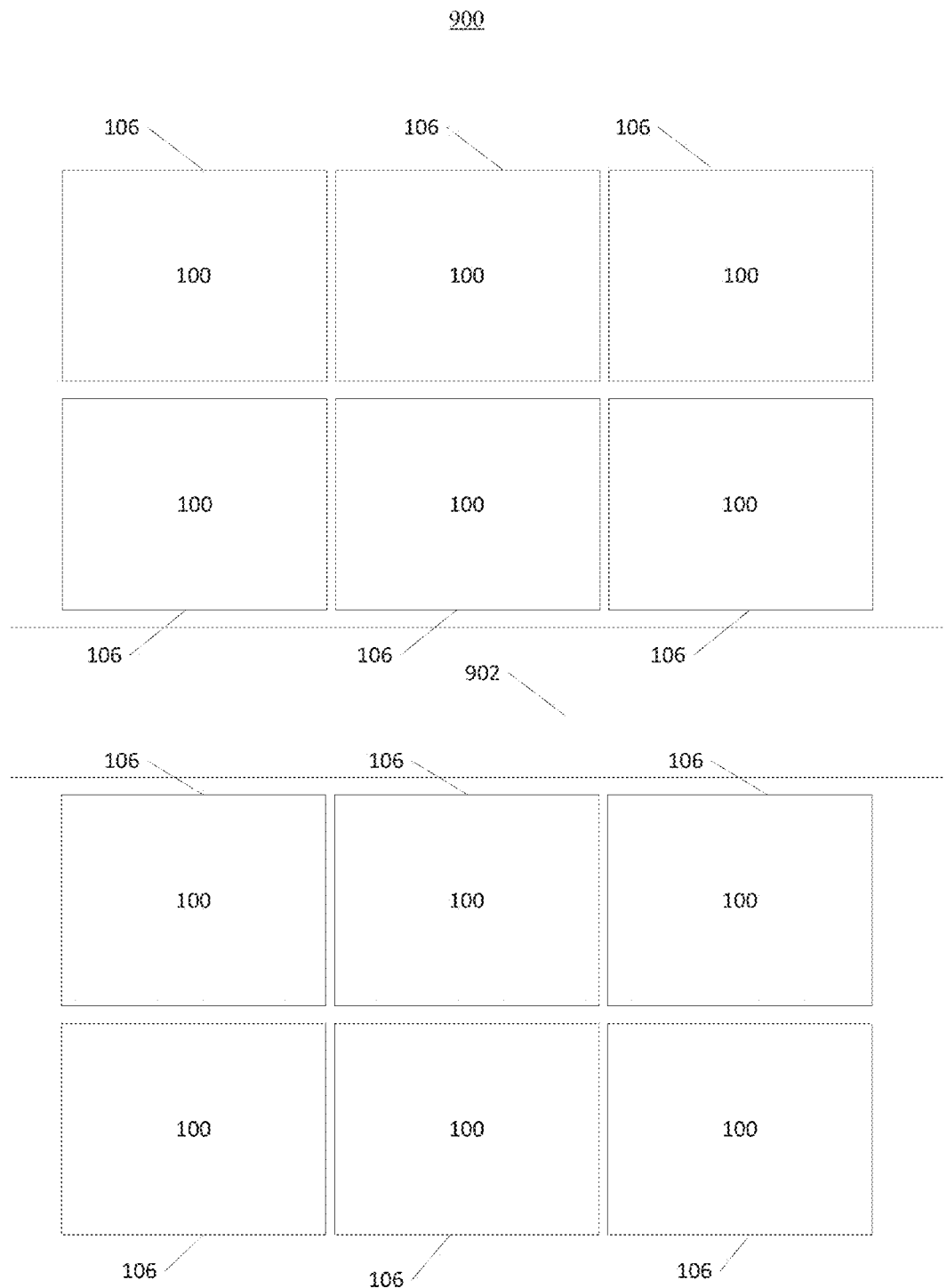

Having thus described some embodiments in general terms, reference will now be made to the accompanying drawings, which are not necessarily drawn to scale, and wherein:

FIG. 1 shows a front view of an example of a configurable drawer-based computing system in accordance with some embodiments;

FIG. 2 shows a left side view of the configurable drawer-based computing system in accordance with some embodiments;

FIG. 3 shows a front view of examples of drawer units of the configurable drawer-based computing system in accordance with some embodiments;

FIG. 4a shows a top view of an example drawer module positioned fully within the interior region of the configurable drawer-based computing system in accordance with some embodiments;

FIG. 4b shows a top view of an example drawer module pulled fully out of the interior region of the configurable drawer-based computing system in accordance with some embodiments;

FIG. 5a shows a front view of an example of a frame power unit of the configurable drawer-based computing system in accordance with some embodiments;

FIG. 5b shows a top view of an example of a frame power unit of the configurable drawer-based computing system in accordance with some embodiments;

FIG. 6 shows a front view of an example of a rackmount unit of the configurable drawer-based computing system in accordance with some embodiments;

FIG. 7a shows a front view of an example of a frame heat transfer unit of the configurable drawer-based computing system in accordance with some embodiments;

FIG. 7b shows a top view of an example of a frame heat transfer unit of the configurable drawer-based computing system in accordance with some embodiments;

FIG. 8 shows a flowchart of an example of a method of managing a configurable drawer-based computing system in accordance with some embodiments; and FIG. 9 shows a floor plan of an example configuration of configurable drawer-based computing systems in accordance with some embodiments.

DETAILED DESCRIPTION

Embodiments will be described more fully hereinafter with reference to the accompanying drawings, in which some embodiments contemplated herein are shown. Indeed, various embodiments may be implemented in many different forms and should not be construed as limited to the embodiments set forth herein; rather, these embodiments are provided so that this disclosure will satisfy applicable legal requirements. Like numbers refer to like elements throughout.

Some embodiments discussed herein may provide for a configurable drawer-based computing system. The configurable drawer-based computing system may include a frame that may be configured to hold a plurality of drawer modules of one or more distinct types, which may each be slidably inserted into or pulled out from the frame. In addition to drawer modules, the frame may additionally be configured to hold modules of other types. The system may supply power, networking, and cooling to each of the drawer modules, even while a drawer module has been pulled out for purposes such as system maintenance. Each drawer module may include printed circuit board assemblies (PCBAs) and other components. The system may provide for configurability in the mounting of modules, including drawer modules, such that a heterogeneous collection of modules that may differ from each other in one or more design characteristics, including without limitation functionality and physical size, may be installed together within the frame, with minimal wasted space within the frame.

The configurable drawer-based computing system may be based on a highly modular, composable, configurable, and field-reconfigurable system architecture that may be designed to enable a large number of possible system configurations, each optimized to support efficiently a specific range of application use cases. This system architecture may be designed to enable the creation of a large selection of distinct, application-optimized designs and configurations for modules, including drawer modules, only a relatively small number of which may be included in any single specific configuration of the configurable drawer-based computing system that may be optimized for a specific application use case. In order to help avoid unnecessary cost and complexity in specific configurations optimized for specific application uses cases, the system architecture may be designed to enable "zero-based" and/or "zero-mass" configuration methods, in which every specific application-optimized configuration of the configurable drawer-based computing system may start with a completely empty frame that may be designed for maximum simplicity and minimum cost. A minimal set of application-optimized modules may then be selected and installed within the frame one by one, until the set of installed modules may collectively provide a level of aggregate functional capacity that may be minimally sufficient to meet the requirements of the specific application use case.

In order to help enable maximum efficiency of specific individual application-optimized system configurations across a highly diverse range of application use cases, the system architecture of the configurable drawer-based computing system may additionally be designed to enable choices among multiple distinct technology options for each of a number of fundamental system functions, which may include functions related to supplying power, networking, and cooling to modules. For example, the system architecture may be designed to enable multiple distinct technology options for removing waste heat from components mounted on PCBAs. A first option may be passive cooling, via mechanisms that may include natural air convection, radiation, and conduction via one or more paths (e.g., electrical conductors connected between a component and a PCBA) that may be included for non-cooling purposes. A second option may be forced-convection air cooling. A third option may be contact cooling via a fluid-cooled mechanism (e.g., a heat transfer grid) that may be shared among many components. A fourth option may be contact cooling via a fluid-cooled mechanism (e.g., a dedicated fluid cooling device) that may be attached directly to an individual component or group of components. The first option may be the simplest and least expensive option to implement, and may be most appropriate for components that produce a relatively low flux of waste heat. Each of the second, third, and fourth options may be progressively more effective for progressively higher-heat-flux components, and also more complex and expensive to implement, relative to the preceding option. The system architecture may be designed to enable concurrent use of some or all of these options within a single application-optimized configuration of the configurable drawer-based computing system, as may be advantageous for cooling concurrently a heterogeneous, diverse collection of individual components that may span a very wide range of per-component waste-heat flux levels.

The configurable drawer-based computing system may incorporate multiple distinct types of PCBAs. These types may include one or more types of application-optimized PCBAs, referred to herein as "databoard" PCBAs, each of which may contribute to the primary functional capacity of the configurable drawer-based computing system by performing any combination of one or more data-related functions such as data creation, networking, processing, storage, and/or other types of data-related functions. In addition to the one or more types of databoard PCBAs, the configurable drawer-based computing system may also incorporate one or more other types of PCBAs that may each be designed with a focus on performing a more specific and/or constrained set of supporting functions within the architecture of the configurable drawer-based computing system, such as power/energy related functions or data network related functions.

The configurable drawer-based computing system may provide for scalable machine packaging, and may be one example of scalable packaging. For example, the configurable drawer-based computing system may contain functional components (e.g., in groups of components, referred to herein as "modules") that may be interconnected to perform a set of functions including but not limited to one or more of the following: data creation, data communication/networking, data processing, and data storage. In some embodiments, the functional components may collectively include one or more basic data-machine elements such as data-producing sensors, data processing elements, volatile and/or nonvolatile data storage/memory elements, data network switching/routing elements, or the like. In some embodiments, these functional components may include individual components that may integrate multiple types of data-machine elements (e.g., System-on-Chip (SoC) components). The configurable drawer-based computing system may be configured to provide packaging for the functional components in a scalable and space efficient manner, while also efficiently delivering to these components a set of services that may include, without limitation, one or more of the following: mechanical support and/or protection, energy input and/or output connections, heat removal, and data input and/or output connections.

Some embodiments may provide for enhanced serviceability and space efficiency. As discussed above, the configurable drawer-based computing system may be configured such that drawer modules may each be slidably inserted into the frame. A drawer module may be slidably pulled out from the frame to provide access to one or more components and/or connections, including networking, processing, storage, power, cooling, and/or other elements, for tasks such as installation, repair, replacement, removal, configuration, reconfiguration, troubleshooting, upgrades, or the like. The drawer module may then be slidably inserted back into the frame. Pulling the drawer module out of the frame may not interrupt the ongoing operation of any of the power, cooling, or data connections to the drawer module. Accordingly, all of the components of the drawer module may continue to function (e.g., at full capacity) without interruption while the drawer module is pulled out of the frame.

Some embodiments may further provide for modules having components that may be disposed and/or interconnected for enhanced serviceability, space efficiency, and cooling efficiency. For example, a drawer module may include a heat transfer grid and one or more PCBAs disposed on each of the two cooling planes of the heat transfer grid. Modules may be mounted to the frame via one or more adjustable mechanisms that may help to facilitate the installation in a single frame of a plurality of modules that may differ from each other in various design characteristics such as functionality and/or physical size. As such, the configurable drawer-based computing system may provide mechanical packaging for modules at the PCBA level that may enable greater component density and superior cooling efficiency, relative to conventional rackmount packaging for computing systems.

FIGS. 1 and 2 respectively show a front view and a left side view of an example of a configurable drawer-based computing system 100 ("system 100") in accordance with some embodiments. To avoid overcomplicating the disclosure, and because of the symmetry of the left side to the right side of system 100, a right side view of system 100 is omitted. Although only a single frame is shown, in some embodiments a configurable drawer-based computing system may include multiple interconnected frames. System 100 may include frame 102 configured to provide a housing and/or mounting structure for a plurality of modules. When modules (e.g., such as drawer module 104) are disposed within frame 102, as discussed in further detail below, system 100 may supply networking, power, and cooling to the modules.

Frame 102 may include frame portions that define an interior region 114 and exterior sides of system 100, including front side 106, left side 108, right side 110, back side 112 (as shown in FIG. 2), top side 116, and bottom side 118. In some embodiments, frame 102 may comprise a skeletal structure such that front side 106, left side 108, right side 110, back side 112, top side 116, and bottom side 118 are each open sides. Open front side 106, as well as any other open sides, may allow the modules and other components within interior region 114 to be accessed, such as by a human or robotic operator or maintainer of system 100. In some embodiments, one or more of the sides may be enclosed, either permanently or via one or more removable coverings.

With reference to FIG. 2, system 100 may further include a plurality of module support mounting rails 120 configured to provide mechanical support for the modules, including module support mounting rails 120*a* and 120*b* disposed at or along left side 108 of frame 102. For example, module support mounting rails 120 may be connected mechanically with frame 102 at or near the top and bottom portions of frame 102. In some embodiments, module support mounting rails 120 may be integrated with or form a portion of frame 102. Here, module support mounting rails 120 may be part of a set of structural elements that may collectively form the skeletal structure of frame 102.

Right side 110 may also include one or more module support mounting rails 120, such as two module support mounting rails disposed in accordance with the locations shown for module support mounting rails 120a and 120b except on the opposite side of frame 102. Although two module support mounting rails are shown in FIG. 2, in various embodiments, a side of frame 102 may include one or more module support mounting rails (e.g., 1, 2, 3, 4, etc.). In some embodiments, one or more module support mounting rails 120 may additionally or alternatively be disposed along back side 112.

As discussed above, module support mounting rails 120 may be configured to provide mechanical support for modules installed in system 100. In some embodiments, for each type of module that may be installed in system 100, there may be one or more corresponding types of module support. Each module support may be used to connect the corresponding type of module mechanically with module support mounting rails 120. When installed in system 100, each module support may be disposed within interior region 114 and configured to slidably receive one or more modules from open front side 106 of frame 102. The combination of a module support together with one or more modules slidably installed in that module support, may be referred to herein as a "unit." For example, system 100 may include one or more drawer units, each comprising a drawer module support 122 and a slidably installed drawer module 104. Similarly, and with reference to FIGS. 5a and 5b, system 100 may include one or more frame power units 500, each comprising a frame power module support 504 and one or more slidably installed frame power modules 502. Also similarly, and with reference to FIG. 6, system 100 may include one or more rackmount units 600, each comprising rackmount module supports 602 and 604, and one or more slidably installed rackmount modules 610. As a final example, and with reference to FIGS. 7a and 7b, system 100 may include one or more frame heat transfer units 700, each comprising a frame heat transfer module support 704 and one or more slidably installed frame heat transfer modules 702.

In some embodiments, module supports (e.g., including drawer module supports 122, frame power module supports 504, rackmount module supports 602 and 604, and frame heat transfer module supports 704) may be adjustably connected with module support mounting rails 120 via a mechanical interface that may be common across all types of module supports in system 100. This common mechanical interface may enable installation of any module support at any of multiple mounting locations along the length dimension (e.g., with reference to FIG. 2) of the plurality of module support mounting rails 120. Module support mounting rails 120 may provide a set of discrete mounting locations, and/or one or more continuous ranges of mounting locations, for installing module supports. As such, system 100 may be able to accommodate a plurality of modules that differ from each other in physical extent along the length dimension of the plurality of module support mounting rails 120, such as modules that differ from each other in function and/or physical size, as discussed in further detail below.

Module supports may be connected adjustably with module support mounting rails 120 using any suitable technique, such as via one or more slide components, clamps, wedge blocks, screws, nuts, bolts, and/or mechanical elements of other types that may secure module supports to specific mounting locations along module support mounting rails 120. In some embodiments, module support mounting rails 120 may include a plurality of mechanical engagement elements (e.g., mounting holes, and/or engagement elements of other types) that may correspond with engagement elements on module supports, such that module supports may be connected with module support mounting rails 120 via these engagement elements.

In some embodiments, some or all of the modules that may be installed in system 100 (e.g., including drawer modules 104, frame power modules 502, rackmount modules 610, and frame heat transfer modules 702), and/or the module supports corresponding with each type of module, may define a common distance or pitch (P) along the length dimension of module support mounting rails 120, as shown in FIG. 1. In some embodiments, pitch P may define a minimum distance between modules installed along the length dimension of module support mounting rails 120. In such embodiments, module supports may be connected adjustably with module support mounting rails 120 at mounting locations as suitable to accommodate modules and/or module supports that occupy a distance along the length dimension of module support mounting rails 120 that is greater than pitch P (e.g., as shown for module 124). In some embodiments, module support mounting rails 120 may include discrete mounting locations that may be spaced uniformly along the length dimension of module support mounting rails 120, separated by a distance that may be related numerically to pitch P (e.g., P, P/2, P/3, P/4, etc.).

In some embodiments, each drawer module 104 may be supported by a drawer module support 122 formed from two separate support portions, such as support portion 122a connected to module support mounting rails 120a and 120b on left side 108 of frame 102, and support portion 122b connected to module support mounting rails on right side 110 of frame 102. Via slide components disposed at the left and right ends of drawer module 104, drawer module 104 may slidably move along support portions 122a and 122b into interior region 114 (e.g., where the drawer module may rest during normal operation of system 100) or out from interior region 114 (e.g., where components of drawer module 104 may be physically accessed). In some embodiments, drawer module supports 122 may each be a single component, such as a U-shaped structure including a rail connector portion that connects the opposite support portions 122a and 122b at back side 112 of frame 102.

The one or more drawer units in system 100, each including a drawer module 104, may be installed for one or more purposes that may include providing functional capacity (e.g., data creation, processing, storage, and/or networking capacity, and/or functional capacity of other types that may be unrelated to data). The number and type of the one or more drawer modules 104 may be selected based on various criteria, which may include aggregate maximum total requirements for each of the types of functional capacity that may be provided by drawer modules 104. In a configuration of system 100 that may include multiple drawer modules 104, the set of drawer modules 104 may be either homogeneous or heterogeneous in design and/or configuration.

FIG. 3 shows a front view of examples of drawer units installed in system 100, including drawer modules 104 and drawer module supports 122. FIG. 4a shows a top view of an example drawer module 104 positioned fully within the interior region 114 of system 100, in accordance with some embodiments. With reference to FIG. 3, drawer module 104 may include heat transfer grid 302, one or more databoard PCBAs 304, one or more databoard PCBAs 306, cooling rails 312a-d, and slide components 322.

Heat transfer grid 302 may provide cooling and/or mechanical support for computing components (e.g., PCBAs, processing components, memory/storage components, power components, networking components, etc.). Heat transfer grid 302 may include a cooling frame that defines first cooling plane 314 and second cooling plane 316. Heat transfer grid 302 may be formed from one or more mechanically rigid and heat conductive materials (e.g., aluminum, and/or any other suitable materials) to facilitate heat transfer between heat transfer grid 302 and thermally coupled components and/or PCBAs. In some embodiments, heat transfer grid 302 may include a row of (e.g., cylindrical shaped) receptacles 318 (e.g., shown in outline in FIG. 3) within the interior of heat transfer grid 302 along a plane defined between first cooling plane 314 and second cooling plane 316. Each receptacle 318 may be configured to receive one or more cooling elements 320, such as (e.g., correspondingly cylindrical shaped) heat pipes that facilitate heat flow along the length of the heat pipes. In that sense, the length of the receptacles (e.g., defined along a line formed between left side 108 and right side 110 of system 100) may define a heat flow dimension in which heat transfer grid 302 is configured to move heat (e.g., generated by databoard PCBAs 304 and 306) most effectively. Additional details and examples of heat transfer grids and modules configured to be cooled using heat transfer grids are discussed in U.S. patent application Ser. No. 14/302,925, titled "Configurable Heat Transfer Grids and Related Methods," filed Jun. 12, 2014, which is hereby incorporated by reference in its entirety.

Drawer module 104 may further include one or more cooling rails, such as cooling rails 312a-d. Cooling rails 312a and 312c may each be secured mechanically with and coupled thermally with first cooling plane 314 of heat transfer grid 302 at an external heat exchange interface of first cooling plane 314. Cooling rails 312b and 312d may each be secured mechanically with and coupled thermally with second cooling plane 316 at an external heat exchange interface of second cooling plane 316. For example, the external heat exchange interface regions may be on the surface of the first cooling plane 314 and second cooling plane 316 along the left and right side edges of heat transfer grid 302, to accommodate component interface regions for mechanical placement and thermal coupling with databoard PCBAs 304 and 306. In some embodiments, external heat exchange interface regions and component interface regions may be at different locations on heat transfer grid 302. Via the thermal coupling at the external heat exchange interface regions (e.g., where cooling rails 312a-d contact heat transfer grid 302, either directly or with a thermal interface material (TIM) in between), heat may be transferred from heat transfer grid 302 to cooling fluid flowing within cooling rails 312, as discussed in further detail below.

Drawer module 104 may further include slide components, such as slide components 322a and 322b. Slide component 322a may be secured to the left side of heat transfer grid 302, and slide component 322b may be secure to the right side of heat transfer grid 302. Each slide component 322 may be configured to slidably engage a drawer module support 122 such that drawer module 104 may be slidably inserted within interior region 114 of frame 102 and pulled out of interior region 114 (e.g., as shown in FIG. 4b) at open front side 106 of frame 102. For example, each slide component 322 may include one or more edge protrusions or the like configured to slidably engage corresponding one or more edge notches of a drawer module support 122. In another example, drawer module support 122 may include one or more corresponding edge protrusions and slide component 322 may include one or more corresponding edge notches that slidably engage each other to enable movement of drawer module 104 to and from interior region 114 of frame 102.

Drawer module 104 may further include one or more databoard PCBAs that may each contribute to the aggregate functional capacity (e.g., data-related functional capacity, and/or non-data-related functional capacity) of system 100. For example, one or more databoard PCBAs 304 may be disposed on first cooling plane 314 of heat transfer grid 302, and one or more databoard PCBAs 306 may be disposed on second cooling plane 316 of heat transfer grid 302. As such, heat transfer grid 302 may provide cooling for the PCBAs disposed on cooling planes 314 and 316. In some embodiments, TIM (e.g., TIM 308 and 310) may be disposed between the PCBAs and the cooling planes of heat transfer grid 302, to facilitate heat transfer from the PCBAs to heat transfer grid 302.

FIG. 4a shows a top view of drawer module 104 including an example PCBA configuration for databoard PCBAs 304a-c disposed on first cooling plane 314. Databoard PCBAs 306 disposed on second cooling plane 316 of heat transfer grid 302 may also be arranged in a similar manner. In some embodiments, the databoard PCBAs 304 and 306 may be secured on both cooling planes 314 and 316 of heat transfer grid 302 in a manner that allocates heat flux from the databoard PCBAs 304 and 306 more efficiently and/or evenly among the cooling elements 320 of heat transfer grid 302. For example, corresponding PCBAs on opposite cooling planes of heat transfer grid 302 may be mirrored or rotated 180 degrees with respect to each other, as discussed in greater detail in U.S. patent application Ser. No. 14/302,925, incorporated by reference above.

Databoard PCBAs 304a-c may each include one or more power components 405, processing components 406, memory/storage components 408, and/or networking components 410, and most or all of these components may be mounted on a single "primary" component side of the PCBA. In some embodiments, each of databoard PCBAs 304a-c may be oriented with its primary component side facing toward cooling plane 314. In FIG. 4a, which illustrates such an embodiment, the locations of components 405-410 are shown using dashed outlines, to indicate that these components are mounted on the primary component side of each of databoard PCBAs 304a-c, facing toward cooling plane 314, and accordingly are not directly visible in the top view of FIG. 4a. In some embodiments, a databoard PCBA 304 may be secured mechanically to heat transfer grid 302 such that the components 405-410 with the largest height (e.g., memory/storage components 408) may be in direct thermal contact (e.g., or with only a TIM in between) with cooling plane 314. Components with lower height (e.g., power components 405, processing components 406, networking components 410, etc.) and relatively high heat flux, may be placed in thermal contact with cooling plane 314 via thermal bridges or thermal risers of suitable height inserted between the components with lower height and cooling plane 314. In another example, a thermal key may be disposed between one or more databoard PCBAs 304a-c and cooling plane 314. Additional details regarding thermal bridges, thermal risers, thermal keys, and techniques for facilitating heat flow from PCBA-mounted components of varying height to heat transfer grid 302, are discussed in greater detail in U.S. patent application Ser. No. 14/302,925, incorporated by reference above.

One or more drawer power PCBAs may also be disposed on cooling planes 314 and/or 316, such as drawer power PCBA 402 disposed on cooling plane 314 as shown in FIG. 4a. Drawer power PCBA 402 may be connected with frame power distribution unit 128 via one or more frame power cables, and may be configured to supply drawer power to each of databoard PCBAs 304a-c via one or more drawer power cables. In some embodiments, drawer power PCBA 402 may be configured to convert frame power received from frame power distribution unit 128 (e.g., single-phase AC at nominal voltage levels such as approximately 277 Vrms, 240 Vrms, 230 Vrms, 208 Vrms, 200 Vrms, 120 Vrms, and/or 100 Vrms; DC at nominal positive and/or negative voltage levels such as approximately 384V, 192V, 48V, and/or 12V; and/or any other suitable formats) into drawer power that may be supplied to each of power components 405 (e.g., DC at nominal positive and/or negative voltage levels such as approximately 48V, 12V, 5V, 3.3V, 2V, and/or 1V, and/or any other suitable formats) via one or more drawer power cables connecting drawer power PCBA 402 with each of databoard PCBAs 304a-c.

Embodiments of drawer power PCBA 402 that include voltages that may not be touch-safe, may incorporate certain safety-related design elements (e.g., such as touch-safe connectors, protective housings, etc.) to help reduce risks of human injury during operations (e.g., maintenance, configuration, reconfiguration, etc.) that may involve access to one or more energized drawer power PCBAs 402. In some embodiments, power conversions performed by a drawer power PCBA 402 may include use of one or more energy storage elements within the drawer power PCBA 402 (e.g., such as capacitors, batteries, and/or energy storage elements of other types) to maintain continuous uninterrupted drawer power during interruptions of frame power. In some embodiments, drawer power PCBA 402 may include one or more redundant internal components, such that drawer power PCBA 402 may continue to operate (e.g., at full or reduced capacity) after failure of one or more of certain internal components. Additionally or alternatively, some configurations of drawer module 104 may include one or more redundant configurations of multiple drawer power PCBAs 402, such that power-related functions within drawer module 104 may continue to operate without interruption (e.g., at full or reduced capacity) during failure and subsequent replacement of one or more drawer power PCBAs 402.

One or more drawer network PCBAs may also be disposed on cooling planes 314 and/or 316, such as drawer network PCBA 404 disposed on cooling plane 314 as shown in FIG. 4a. Drawer network PCBA 404 may be connected with frame data cable manager 126 via one or more frame data cables, and may be configured to supply data communication to databoard PCBAs 304a-c. Drawer network PCBA 404 may be connected via one or more drawer data cables with networking components 410 of each of databoard PCBAs 304a-c. Additionally or alternatively, one or more networking components 410 of databoard PCBAs 304a-c may be connected directly with frame data cable manager 126 via one or more frame data cables.

In some embodiments, drawer network PCBA 404 may include one or more redundant internal components, such that drawer network PCBA 404 may continue to operate (e.g., at full or reduced capacity) after failure of one or more of certain internal components. Additionally or alternatively, some configurations of drawer module 104 may include one or more redundant configurations of multiple drawer network PCBAs 404, such that network-related functions within drawer module 104 may continue to operate without interruption (e.g., at full or reduced capacity) during failure and subsequent replacement of one or more drawer network PCBAs 404.

In some embodiments, as a supplement or alternative to heat transfer via heat transfer grid 302, one or more additional heat transfer mechanisms may be employed to remove waste heat from components mounted on PCBAs (e.g., databoard PCBAs 304a-c, drawer power PCBAs 402, and/or drawer network PCBAs 404) within drawer module 104. A first example may be passive cooling, via mechanisms that may include natural air convection, radiation, and conduction via one or more paths (e.g., electrical conductors connected between a component and a PCBA) that may be included for non-cooling purposes. A second example may be forced-convection air cooling, which may be enabled in system 100 by one or more exhaust fan modules 134 as described above. A third example may be contact cooling via a fluid-cooled mechanism (e.g., a dedicated fluid cooling device) that may be attached directly to a single component or group of components (e.g., between a component and a cooling plane of heat transfer grid 302).

As shown in FIG. 4a, to enable the use of one or more dedicated fluid cooling devices within drawer module 104, drawer module 104 may include one or more frame cooling fluid supply/return tube connection point pairs 426. FIG. 4a shows an example dedicated fluid cooling device 430 attached directly to a processing SoC, connected via frame cooling fluid supply/return tube pair 428 to a frame cooling fluid supply/return tube connection point pair 426.

Each of the PCBA-mounted components within drawer module 104 may be cooled via any combination of one or more of the heat transfer mechanisms described herein. For one or more of the components within drawer module 104, this combination of heat transfer mechanisms may not include heat transfer via heat transfer grid 302. Examples of such components may include relatively low-heat-flux components that may be cooled effectively via passive cooling and/or forced-convection air cooling; and components with heat flux so high that a dedicated fluid cooling device may be required, because other heat transfer mechanisms described herein, including heat transfer via heat transfer grid 302, may not provide sufficient cooling. Such components may advantageously not require any provisions (e.g., thermal riser, thermal bridge, thermal key, or TIM) for thermal contact with heat transfer grid 302. In some embodiments, it may be advantageous to mount one or more such components on a side of a PCBA facing away from heat transfer grid 302. In some specific configurations of drawer module 104, all of the PCBA-mounted components may be cooled via heat transfer mechanisms other than heat transfer via heat transfer grid 302. In such configurations, cost may be reduced by omitting cooling rails 312, and/or replacing heat transfer grid 302 with a simpler structure (e.g., a simple plate) that may be comparable to heat transfer grid 302 in key characteristics including overall shape and structural load-bearing capacity, but may lack the enhanced heat transfer characteristics of heat transfer grid 302.

Drawer module 104 may further include guide arm 412, attached to drawer module support 122b at a first end 414 and attached to heat transfer grid 302 at a second end 416. Guide arm 412 may be secured with one or more frame power cables, frame data cables, frame cooling fluid supply tubes, and frame cooling fluid return tubes connected with drawer module 104, to provide for orderly movement of the cables and tubes without excessive mechanical stresses and without requiring any disconnections. Each of these frame power cables, frame data cables, and frame cooling fluid tubes may be flexible and capable of bending or otherwise conforming to movements of guide arm 412. In some embodiments, guide arm 412 may include first portion 418, second portion 420, and joint 422 connecting first portion 418 and second portion 420. Each of first portion 418 and second portion 420 may be secured with portions of the one or more frame power cables, frame data cables, frame cooling fluid supply tubes, and frame cooling fluid return tubes, such that cables and tubes follow the movement and position of guide arm 412. First portion 418 and second portion 420 may bend with respect to each other via joint 422. As such, guide arm 412 may be configured to bend at joint 422 when drawer module 104 is inserted within interior region 114 of frame 102, and unbend at joint 422 when drawer module 104 is pulled out of interior region 114.

In some embodiments, frame cooling fluid supply tubes may be located in relatively close proximity to frame cooling fluid return tubes along guide arm 412. In such embodiments, one or more layers of thermal insulation may be applied to the outer surfaces of one or more of the frame cooling fluid supply tubes, and/or one or more of the frame cooling fluid return tubes, in order to help reduce thermal inefficiencies that could result from undesirable "short-circuit" heat transfer that could occur along guide arm 412, from heated frame cooling fluid flowing through frame cooling fluid return tubes, directly to cooled frame cooling fluid flowing through frame cooling fluid supply tubes located in relatively close proximity along guide arm 412. In some embodiments, other design approaches may additionally or alternatively be employed to help reduce this type of short-circuit heat transfer. For example, instead of a single guide arm 412, a drawer unit may be configured with multiple separate guide arms, each occupying its own space (e.g., a scissors-type configuration with a first guide arm attached to the right side of drawer module 104 as shown for guide arm 412, and a second, separate guide arm in a mirror-image configuration, attached to the left side of drawer module 104). In such a configuration, frame cooling fluid supply tubes may be secured with one set of one or more guide arms, and frame cooling fluid return tubes may be secured with a separate set of one or more guide arms, to help reduce short-circuit heat transfer.

FIG. 4b shows a top view of an example drawer module 104 pulled fully out of interior region 114 in accordance with some embodiments. As shown, drawer module 104 may be pulled out of interior region 114 via the slidable connections between drawer module support 122 (including support portions 122a and 122b) and slide components 322a and 322b attached mechanically to drawer module 104 (e.g., via heat transfer grid 302). When drawer module 104 is pulled out of interior region 114, guide arm 412 (e.g., as well as the cables and/or tubes secured with guide arm 412) may unbend relative to the bent position shown in FIG. 4a where drawer module 104 is positioned entirely within interior region 114. In some embodiments, once pulled fully out of interior region 114 as shown in FIG. 4b, drawer module 104 may additionally be capable of being folded downwards and/or upwards along axis 424, to provide more convenient access to components disposed on cooling planes 314 and/or 316, respectively, of heat transfer grid 302.

System 100 may further include a set of service distribution units (SDUs). These SDUs may be used to distribute services, including without limitation data networking, power, and cooling, among modules within frame 102, including drawer modules 104. The SDUs may include frame data cable manager 126, frame power distribution unit 128, frame cooling fluid supply manifold 130, and/or frame cooling fluid return manifold 132. In some embodiments, to provide space for the sliding of drawer modules 104 within interior region 114, and for adjustable positioning of drawer module supports 122 along module support mounting rails 120, SDUs may be disposed at or along back side 112 of frame 102 as shown in FIG. 4a. In some embodiments, one or more SDUs may be disposed along another side of frame 102 (e.g., in gaps around module support mounting rails 120 along the left and right sides), or at an exterior side of frame 102. In some embodiments, frame 102 may include a plurality of mounting rails for SDUs, such as SDU mounting rails 125 along back side 112 of frame 102 as shown in FIGS. 4a and 4b. SDU mounting rails 125 may allow for adjustable positioning of a configurable number of SDUs of various types, shapes, and/or sizes along back side 112 of frame 102. In some embodiments, SDU mounting rails 125 may be integrated with or form a portion of frame 102. Here, SDU mounting rails 125 may be part of a set of structural elements that collectively form the skeletal structure of frame 102. For each of frame data cable manager 126, frame power distribution unit 128, frame cooling fluid supply manifold 130, and frame cooling fluid return manifold 132, some embodiments may make available two or more design variants that may differ from each other in various characteristics that may include size, shape, and/or functional capacity (e.g., type and maximum total number of frame data cables for a frame data cable manager 126; frame power format and maximum total current for a frame power distribution unit 128; and maximum total flow rate for a frame cooling fluid supply manifold 130 and a frame cooling fluid return manifold 132). A specific configuration of modules installed in frame 102, including drawer modules 104, may create specific aggregate capacity requirements for services within frame 102, including data networking, power, and cooling. To meet these requirements, a corresponding specific configuration of SDUs may be installed along SDU mounting rails 125. This SDU configuration may include one or more design variants for each of frame data cable manager 126, frame power distribution unit 128, frame cooling fluid supply manifold 130, and/or frame cooling fluid return manifold 132. The SDU configuration may further include one or more individual instances of each installed design variant, as necessary to meet the aggregate capacity requirements. SDU mounting rails 125 may be designed to accommodate any number of installed SDUs, subject only to the constraint that the total distance along the length of SDU mounting rails 125 that is occupied by installed SDUs, must be less than or equal to the total length of SDU mounting rails 125. For illustrative purposes, FIGS. 1, 2, 4a, and 4b show a simplified SDU configuration with a single instance of each of frame data cable manager 126, frame power distribution unit 128, frame cooling fluid supply manifold 130, and frame cooling fluid return manifold 132, installed in specific positions along SDU mounting rails 125. In various embodiments, many other SDU configurations may be possible. In some embodiments, some or all of the functions of frame data cable manager 126, frame power distribution unit 128, frame cooling fluid supply manifold 130, and/or frame cooling fluid return manifold 132, may be integrated into a single SDU. A group of SDUs, such as frame data cable manager 126, frame power distribution unit 128, frame cooling fluid supply manifold 130, and frame cooling fluid return manifold 132, may include one or more mechanical design elements that may be uniform across each of the SDUs in the group. A first such uniform design element may be the overall height of the SDUs. A second uniform design element may be a common mechanical interface between each SDU and SDU mounting rails 125. A third uniform design element may be the locations of service access points along the length of each SDU, where cables and/or tubes may enter the SDU and/or attach to the SDU via connectors.

In some embodiments, SDUs may be designed to provide service access points that are as close as possible to every location within frame 102 at which a module (e.g., drawer module 104) may be installed. For example, service access points may be provided along the length of each SDU at intervals that may correspond with one or more multiples of pitch P. This may advantageously help to minimize the total length of exposed runs of cables and tubes outside of SDUs within frame 102, thereby reducing risk of damage to cables and tubes, and minimizing the space used within frame 102 for cables and tubes. For each of the individual services required by modules within frame 102, which may include without limitation frame data networking, frame power, frame cooling fluid supply, and/or frame cooling fluid return, in some embodiments a single SDU may have sufficient aggregate capacity, and a sufficient total number of service access points, to provide the required service to all of the modules in a fully populated configuration of frame 102 that includes the maximum possible number of minimum-size drawer modules 104. In other embodiments, multiple SDUs may be required for sufficient aggregate capacity, and a sufficient total number of service access points, to provide the required service to all of the modules in a fully populated configuration of frame 102.

Frame data cable manager 126 may provide mechanical guidance and/or containment for a plurality of frame data cables within frame 102 of system 100. Frame data cables may be used to enable modules within system 100 (e.g., drawer modules 104 and modules of other types) to communicate with each other, and/or to enable modules within system 100 to communicate with one or more external systems that are separate from system 100. Each frame data cable may include one or more data-carrying conductors of various types, including without limitation optical conductors and/or electrical conductors. Each frame data cable may have two or more endpoints, each with a connector that may be mated with either a compatible connector on a module of system 100, or a compatible connector in an external system. Frame data cable manager 126 may include mechanical design elements, such as internal cable guides and/or mechanical design elements of other types, that may help to protect frame data cables within frame data cable manager 126 from mechanical stresses and/or damage, and/or may help to maximize the efficiency of space utilization within frame data cable manager 126. In some embodiments, frame data cable manager 126 may include along its length a plurality of apertures, each of which may function as a service access point for entry of one or more frame data cables that may be connected to one or more nearby modules within frame 102. Frame data cable manager 126 may additionally include one or more apertures at or near each end, each of which may function as a service access point for entry of one or more frame data cables that may be connected outside of frame 102.

Frame power distribution unit 128 may be configured to receive frame power from a power source via one or more electrical inlet connection points, and distribute the received frame power to modules within frame 102 via a plurality of electrical outlet connection points. Each such connection point may include one or more terminal blocks, pluggable connectors, and/or other suitable mechanisms for connecting electrical conductors with frame power distribution unit 128. In some embodiments, the one or more inlet connection points may be located at or near one or both of the ends of frame power distribution unit 128, and/or at any other locations along the length dimension of frame power distribution unit 128. The plurality of outlet connection points may be distributed along the length of frame power distribution unit 128, and each may function as a service access point for attaching one or more frame power cables that may be used to supply frame power to one or more modules within frame 102. For example, one end of a frame power cable may be attached to an outlet connection point of frame power distribution unit 128, and the other end of the frame power cable may be attached to one or more drawer power PCBAs 402 in a drawer module 104. Each inlet connection point of frame power distribution unit 128 may be connected to one or more cables, busbars, and/or other suitable types of electrical conductors. These conductors may be connected either directly to a facility power source outside of frame 102, or to a frame power source (e.g., frame power unit 500 described below) within frame 102.

The format of frame power at the one or more inlet connection points may be one or more of many suitable formats, including without limitation three-phase wye-connected AC at nominal voltage levels such as approximately 480 Vrms phase-to-phase/277 Vrms phase-to-neutral, 415 Vrms phase-to-phase/240 Vrms phase-to-neutral, 400 Vrms phase-to-phase/230 Vrms phase-to-neutral, and/or 208 Vrms phase-to-phase/120 Vrms phase-to-neutral; and DC at nominal positive and/or negative voltage levels such as approximately 384V, 192V, 48V, and/or 12V. The format of frame power at the plurality of outlet connection points may correspond with the format at the one or more inlet connection points, and may incorporate one or more format conversions. For example, inlet frame power in the format of three-phase wye-connected AC at nominal voltage levels of approximately 480/277 Vrms may be converted to outlet frame power in the format of single-phase AC at a nominal voltage level of approximately 277 Vrms, with the plurality of outlet connection points divided into three equal-sized groups, one for each of the three phases of AC inlet frame power.

Frame cooling fluid supply manifold 130 may be configured to receive cooled frame cooling fluid from a cooling fluid supply connection via one or more inlet connection points, and distribute the cooled fluid to drawer modules 104 within frame 102 via a plurality of outlet connection points. Each such connection point may be a threaded tap, pluggable drybreak connector, or other suitable mechanism for connecting fluid-carrying tubes with frame cooling fluid supply manifold 130. In some embodiments, the one or more inlet connection points may be located at or near one or both of the ends of frame cooling fluid supply manifold 130, and/or at any other locations along the length of frame cooling fluid supply manifold 130. The plurality of outlet connection points may be distributed along the length of frame cooling fluid supply manifold 130, and each may function as a service access point for attaching one or more frame cooling fluid supply tubes that may be used to supply cooled frame cooling fluid to one or more drawer modules 104 within frame 102.

For example and with reference to FIG. 3, one end of a frame cooling fluid supply tube may be attached to an outlet connection point of frame cooling fluid supply manifold 130, and the other end of the frame cooling fluid supply tube may be attached to frame cooling fluid supply distribution plumbing in a drawer module 104 that may be connected with each of cooling rails 312a, 312b, 312c, and 312d of the drawer module 104. Each inlet connection point of frame cooling fluid supply manifold 130 may be connected to one or more tubes that may then be attached either directly to a facility cooling fluid supply connection outside of frame 102, or to a frame cooling fluid supply connection (e.g., on frame heat transfer unit 700 described below) within frame 102. The frame cooling fluid supplied at the one or more inlet connection points may be any one of many possible choices for a suitable fluid, including without limitation water; a mixture of water with one or more other liquids; refrigerant; and other cooling fluids not containing any water.

When received within cooling rails 312 of a drawer module 104, the cooled frame cooling fluid may flow through channels within cooling rails 312, transferring heat (e.g., generated by the PCBAs of the drawer module 104) from heat transfer grid 302 in thermal contact with cooling rails 312, to the cooled frame cooling fluid via solid-to-fluid heat transfer. Within cooling rails 312, the cooled frame cooling fluid may become heated, and the heated frame cooling fluid may be removed from the cooling rails via a frame cooling fluid return tube.

The function of frame cooling fluid return manifold 132 may be exactly the opposite of the function of frame cooling fluid supply manifold 130. Due to this symmetry, the physical structure of frame cooling fluid return manifold 132 may be similar to or identical to that of frame cooling fluid supply manifold 130, with the possible exception of features such as labeling and/or color coding. Frame cooling fluid return manifold 132 may be configured to receive heated frame cooling fluid from drawer modules 104 within frame 102 via a plurality of inlet connection points, and return the heated frame cooling fluid to a cooling fluid return connection via one or more outlet connection points. Each such connection point may be a threaded tap, pluggable dry-break connector, or other suitable mechanism for connecting fluid-carrying tubes with frame cooling fluid return manifold 132. In some embodiments, the one or more outlet connection points may be located at or near one or both of the ends of frame cooling fluid return manifold 132, and/or at any other locations along the length of frame cooling fluid return manifold 132. The plurality of inlet connection points may be distributed along the length of frame cooling fluid return manifold 132, and each may function as a service access point for attaching one or more frame cooling fluid return tubes that may be used to receive heated frame cooling fluid from one or more drawer modules 104 within frame 102.

For example and with reference to FIG. 3, one end of a frame cooling fluid return tube may be attached to an inlet connection point of frame cooling fluid return manifold 132, and the other end of the frame cooling fluid return tube may be attached to frame cooling fluid return distribution plumbing in a drawer module 104 that may be connected with each of cooling rails 312a, 312b, 312c, and 312d of the drawer module 104. In some embodiments, the number of inlet connection points on frame cooling fluid return manifold 132 may be equal to the number of outlet connection points on frame cooling fluid supply manifold 130, to provide loops of frame cooling fluid flow through each of the cooling rails 312. Each outlet connection point of frame cooling fluid return manifold 132 may be connected to one or more tubes that may then be attached either directly to a facility cooling fluid return connection outside of frame 102, or to a frame cooling fluid return connection (e.g., on frame heat transfer unit 700 described below) within frame 102.

With reference to FIGS. 1 and 2, system 100 may include one or more exhaust fan modules 134, to supply forced-convection cooling air flow for removing waste heat from components in modules installed in frame 102, as a supplement or alternative to other cooling mechanisms that may be included in specific configurations of system 100. Configurations of system 100 that may include one or more exhaust fan modules 134, may additionally include coverings that may fully enclose left side 108, right side 110, back side 112, and bottom side 118 of frame 102, thereby forming an air plenum within interior region 114 of frame 102. This air plenum may be open only on front side 106 and top side 116 of frame 102. Each exhaust fan module 134 may be mounted at or near top side 116 of frame 102, and may be configured to create suction within the air plenum. This suction may cause a flow of ambient air to be pulled into the plenum from front side 106 of frame 102. This air may then flow from front side 106 toward back side 112 of frame 102, moving across components in modules installed within frame 102, and absorbing waste heat from these components. The heated air may then be pulled upward toward top side 116 of frame 102 and into one or more exhaust fan modules 134, which may then expel the heated air vertically from system 100. Configurations of system 100 that may include one or more exhaust fan modules 134, may additionally include one or more airflow-guiding devices, such as curved baffles and/or other types of airflow-guiding devices, mounted near back side 112 of frame 102, to help turn the flow of heated air upward toward top side 116 of frame 102. Each of the one or more exhaust fan modules 134 may be configured to receive frame power via one or more frame power cables connected with one or more frame power distribution units 128, and may additionally be configured to receive frame data networking (e.g., for monitoring and/or control) via one or more frame data cables connected with one or more frame data cable managers 126.

Configurations of system 100 that may include one or more exhaust fan modules 134, may additionally include one or more air-to-fluid heat exchanger modules 136, mounted adjacent to (e.g., below or above) the one or more exhaust fan modules 134. The one or more air-to-fluid heat exchanger modules 136 may be configured to remove heat from cooling air, such that the temperature of cooling air expelled vertically from system 100, may be reduced. In some configurations of system 100, the temperature of cooling air expelled vertically from system 100, may under some conditions be approximately the same as, or lower than, the temperature of cooling air entering front side 106 of frame 102. Removal of heat from cooling air expelled from system 100, may advantageously reduce or eliminate requirements to provide infrastructure external to system 100 for the purpose of removing heat from cooling air expelled from system 100. Each of the one or more air-to-fluid heat exchanger modules 136 may be configured to receive cooled frame cooling fluid via one or more frame cooling fluid tubes connected with one or more frame cooling fluid supply manifolds 130. The air-to-fluid heat exchanger module 136 may then pass the received cooling fluid through one or more heat exchange elements (e.g., cooling fluid tubes with attached heat-absorbing fins), such that heat energy may be transferred to the cooling fluid from cooling air flowing through the air-to-fluid heat exchanger module 136. The heated cooling fluid may then be passed via one or more frame cooling fluid tubes into one or more frame cooling fluid return manifolds 132. The air-to-fluid heat exchanger module 136 may additionally be configured to receive frame data networking (e.g., for monitoring and/or control) via one or more frame data cables connected with one or more frame data cable managers 126.

FIGS. 5a and 5b show front and top views, respectively, of an example frame power unit 500 of system 100, in accordance with some embodiments. System 100 may be connected to one or more facility power sources (e.g., via electrical connections made at or near the top and/or bottom of frame 102). If these facility power sources can supply power in a format that may be usable directly by one or more frame power distribution units 128, and by modules in system 100 (e.g., drawer modules 104), then direct electrical connections may be made between the one or more facility power sources and one or more frame power distribution units 128. In this case, it may not be necessary to install any frame power units 500 in system 100. This may help to reduce capital, operational, and maintenance costs of system 100, and space within frame 102 that would have been occupied by one or more frame power units 500, may advantageously be used for other purposes (e.g., to install additional drawer modules 104). Otherwise, one or more frame power units 500 may be installed in system 100, for one or more purposes that may include converting power from the one or more facility sources into a format that may be usable directly by one or more frame power distribution units 128, and by modules in system 100. The number and type of the one or more frame power units 500 may be selected based on various criteria, which may include the aggregate maximum total frame power requirement across all of the electrical loads installed in system 100. In a configuration of system 100 that may include multiple frame power units 500, the set of frame power units 500 may be either homogeneous or heterogeneous in design and/or configuration.

Frame power unit 500 may include one or more frame power modules 502, and frame power module support 504. Frame power module support 504 may include base portion 506 configured to slidably receive and mechanically secure frame power modules 502 with frame power module support 504. Frame power module support 504 may include mechanical elements, such as slide components 508, that may implement a mechanical interface to the plurality of module support mounting rails 120 that may be common across all types of module supports in system 100. As discussed above, this common mechanical interface may enable installation of any module support, including a frame power module support 504, at any of multiple mounting locations along the length dimension of the plurality of module support mounting rails 120.

With reference to FIG. 5b, in some embodiments frame power module support 504 may include one or more backplanes 520, for one or more purposes that may include making connections among one or more frame power modules 502, other parts of system 100, and facilities external to system 100. Such connections may include electrical power connections, and may additionally include frame cooling fluid connections and/or data connections. Each backplane 520 may include one or more pathways along its length dimension. These may include pathways (e.g., electrical conductors) for electrical power flow; pathways (e.g., fluidic tubes) for frame cooling fluid flow; and/or pathways (e.g., electrical and/or optical conductors) for data flow. Each such pathway may have a plurality of connection points. In some embodiments, for each frame power module 502, the one or more backplanes 520 in frame power module support 504 may collectively provide a set of connection points in the form of one or more backplane blind-mate connectors 522 that may be configured to mate with corresponding module blind-mate connectors 524 on the frame power module 502, when the frame power module 502 is slidably inserted into frame power module support 504. Each mated pair of a backplane blind-mate connector 522 and a module blind-mate connector 524 may establish one or more connections between power, cooling, and/or data pathways in the one or more backplanes 520, and corresponding pathways within the frame power module 502. The functions of such pathways may include transfer of inlet facility power into the frame power module 502; transfer of converted outlet frame power out of the frame power module 502; transfer of cooled frame cooling fluid into the frame power module 502; transfer of heated frame cooling fluid out of the frame power module 502; and transfer of data (e.g., for one or more purposes that may include monitoring and/or control) into and out of the frame power module 502.

Pathways in the one or more backplanes 520 in frame power module support 504 may include additional connection points, for one or more purposes that may include enabling connections to other parts of system 100 and to facilities external to system 100. Each such connection point may include one or more pluggable connectors, terminal blocks, and/or other suitable connection mechanisms. A backplane 520 may include one or more facility power conductors, each with one or more facility power inlet connection points 526 for attachment to one or more external facility power inlet connection points (e.g., via one or more cables, busbars, and/or other suitable types of electrical conductors). In some embodiments, one or more external facility power inlet connection points 526 may be located at or near the top and/or the bottom of frame 100. A backplane 520 may additionally include one or more frame power conductors, each with one or more frame power outlet connection points 528 for attachment to inlet connection points of one or more frame power distribution units 128 (e.g., via one or more flexible electrical cables). A backplane 520 may include one or more frame cooling fluid supply tubes, each with one or more frame cooling fluid supply connection points 530 for attachment to one or more frame cooling fluid supply manifolds 130 (e.g., via one or more flexible tubes). Similarly, a backplane 520 may include one or more frame cooling fluid return tubes, each with one or more frame cooling fluid return connection points 532 for attachment to one or more frame cooling fluid return manifolds 132. A backplane 520 may additionally include one or more data pathways, each with one or more data connection points 534 for attachment to one or more frame data cable managers 126 (e.g., via one or more flexible cables containing electrical and/or optical conductors).

In some embodiments, the connection points of the one or more backplanes 520 in frame power module support 504 may be positioned such that when frame power module support 504 is installed in frame 102, all of these connection points may be disposed toward back side 112 of frame 102, and may not be physically accessible directly via front side 106 of frame 102 during normal operation of system 100. Such positioning of these connection points may advantageously help to minimize the length of the connections (e.g., via flexible cables and tubes) that are needed between backplanes 520 and other connection points both within and external to system 100. Such positioning may also advantageously help to reduce risk of human injuries and/or equipment damage that could occur as a result of body parts, tools, and/or other objects accidentally contacting energized electrical conductors during procedures involving system 100 that may include installation, operation, maintenance, and reconfiguration.

The use of blind-mate connectors 522 and 524 to make connections between backplanes 520 and frame power modules 502, may enable frame power modules 502 to be slidably inserted into and removed from frame power module support 504 without requiring attachment or detachment of any of the connections between backplanes 520 and other connection points within and external to system 100. This may in turn advantageously enable slidable insertion and removal of frame power module 502 via physical access to only front side 106 of frame 102, without requiring any physical access to left side 108, right side 110, back side 112, top side 116, or bottom side 118 of frame 102.

In some embodiments, a frame power module 502 may include one or more instances of each of one or more distinct types of internal functional blocks that may collectively implement the functions of frame power module 502. Examples of these types of functional blocks may include power conversion block 536, energy storage block 538, and control block 540. Certain design elements may be common across multiple block types. For example, a block that may require electrical power for its internal operations, may be configured to receive this power from facility inlet power pathways and/or converted frame power pathways in frame power module 502. As a second example, a block may be configured to remove internally generated waste heat by receiving cooled frame cooling fluid from a frame cooling fluid supply pathway in frame power module 502, and returning heated frame cooling fluid to a frame cooling fluid return pathway in frame power module 502. As a third example, a block may include one or more elements that may use one or more data pathways, including data pathways in frame power module 502 and data pathways in backplane 520, to communicate with one or more other blocks in frame power module 502; one or more other frame power modules 502 and/or modules of other types in system 100; and/or one or more systems external to system 100. Such elements may include controllers, sensors, actuators, and/or elements of other types that may send and/or receive data.

At each of one or more points within a block, one or more sensors may measure time-varying conditions that may include component parameters such as temperature; electrical parameters such as voltage, current, AC frequency, and AC waveform characteristics; and frame cooling fluid parameters such as temperature, pressure, and flow rate. One or more computing elements within system 100 and/or external to system 100 may use data from these sensors to help monitor the health of components within frame power module 502, and/or the health of the facility source supplying power to frame power module 502. These computing elements may additionally use this health information to perform various automated actions, which may include sending notifications, disabling failing components, adjusting system operational parameters (e.g., to help compensate for component failures), or proactively performing protective orderly shutdowns of healthy components (e.g., after detecting facility power source impairments that may be predictive of imminent failure of the facility power source).

Power conversion block 536 may be configured to receive power from facility power inlet pathways in frame power module 502, convert the received power into a different format, and feed this converted power into converted frame power pathways in frame power module 502. Examples of facility power inlet formats that power conversion block 536 may be configured to accept, may include three-phase wye-connected AC at nominal voltage levels of approximately 480 Vrms phase-to-phase/277 Vrms phase-to-neutral, 415 Vrms phase-to-phase/240 Vrms phase-to-neutral, 400 Vrms phase-to-phase/230 Vrms phase-to-neutral, or 208 Vrms phase-to-phase/120 Vrms phase-to-neutral; and DC at nominal positive and/or negative voltage levels such as approximately 384V, 192V, 48V, and/or 12V. Examples of converted frame power formats that power conversion block 536 may be configured to produce, may include DC at nominal positive and/or negative voltage levels such as approximately 384V, 192V, 48V, or 12V.

Energy storage block 538 may be configured to enable multiple operational modes, which may include a charging mode, a discharging mode, and a standby mode. These operational modes may be mutually exclusive, such that energy storage block 538 may always be in exactly one of these modes. In the charging mode, energy storage block 538 may receive power from converted frame power pathways in frame power module 502, and store the energy within one or more internal energy storage elements (e.g., such as capacitors, batteries, and/or energy storage elements of other types). In the discharging mode, energy storage block 538 may use internally stored energy to feed power to converted frame power pathways in frame power module 502. In the standby mode, energy storage block 538 may disconnect itself from converted frame power pathways in frame power module 502, neither receiving nor supplying energy. During normal operation of system 100, energy storage blocks 538 may operate in standby mode. If inlet facility power to system 100 is interrupted temporarily, system 100 may be able to continue operating without any interruption, by switching one or more energy storage blocks 538 temporarily into discharging mode. When inlet facility power to system 100 is subsequently restored, system 100 may switch the one or more energy storage blocks 538 temporarily into charging mode, in order to replenish internal energy storage, before switching these energy storage blocks 538 back into standby mode.

Control block 540 may be configured with computing hardware, firmware, and software designed to help coordinate the operation of one or more frame power modules 502 within system 100. To help effect this coordination, control block 540 may communicate with other controllers, sensors, actuators, and/or elements of other types within one or more other functional blocks within the same frame power module 502; one or more other frame power modules 502 and/or modules of other types within system 100; and/or one or more other systems external to system 100.

In some embodiments, system 100 may be configured for facility power redundancy. In such embodiments, system 100 may have a total of two or more separate and independent facility power inlet connections, each made at an inlet connection point of a frame power distribution unit 128 or at a facility power inlet connection point 526 of a backplane 520 of a frame power module support 504. Each such connection may be attached to one of a total of two or more separate and independent facility power sources. If one or more of these attached facility power sources may fail, one or more other attached facility power sources may remain operational and may be able to continue to feed facility power to system 100. Depending on the specific configuration of the two or more attached facility power sources, the specific internal configuration of system 100, and the specific set of failed facility power sources, system 100 may be able to continue to operate at either full or partial functional capacity during a failure of one or more (but not all) of the two or more attached facility power sources.

In some embodiments, one or more backplanes 520 of frame power module support 504 may be configured to enable slidable insertion of one or more frame power modules 502, including engagement of backplane blind-mate connectors 522 and module blind-mate connectors 524, at times when one or more facility power inlet connection points 526 may be energized, and one or more frame cooling fluid supply connection points 530 may be pressurized. This may be referred to herein as "hot-plug" capability for frame power modules 502, which may require blind-mate connectors 522 and 524 to include specific design characteristics, such as arc-flash prevention and/or suppression for electrical connections, and dry-break capability for fluidic connections.

Similarly, in some embodiments, one or more backplanes 520 of frame power module support 504 may be configured to enable slidable removal of one or more frame power modules 502, including disengagement of backplane blind-mate connectors 522 and module blind-mate connectors 524, at times when one or more facility power inlet connection points 526 may be energized, and one or more frame cooling fluid supply connection points 530 may be pressurized. This may be referred to herein as "hot-unplug" capability for frame power modules 502. In some embodiments with hot-plug and hot-unplug capabilities for frame power modules 502, each frame power module 502 may be configured to provide one or more DC electrical outputs, each at a regulated fixed voltage level and at a current level that may vary dynamically according to the aggregate of the instantaneous current demands of one or more connected electrical loads (e.g., one or more drawer power PCBAs 402, connected via one or more frame power distribution units 128), up to a maximum output current capability defined by the design of frame power module 502.

Such embodiments may further include "current sharing" capability, in which corresponding DC outputs of a set of two or more frame power modules 502, spanning across one or more frame power units 500 in system 100, may be wired together in parallel to feed all of the electrical loads (e.g., one or more drawer power PCBAs 402) in a shared "frame power domain", such that each of these two or more frame power modules 502 may contribute a roughly equal share of the aggregate current level demanded by the loads in the shared frame power domain. Such embodiments may advantageously enable resilient configurations of frame power modules 502 in system 100. As one example of such a resilient configuration of frame power modules 502 in system 100, multiple identically configured frame power modules 502 may be connected to feed current to a shared frame power domain, such that the aggregate maximum output current capability across all of these frame power modules 502 may exceed the maximum aggregate current demand across all of the loads in the shared frame power domain, by an amount that may be greater than or equal to an overprovisioning multiple M of the maximum output current capability of a single frame power module 502. In such a configuration of frame power modules 502 in system 100, which may be referred to herein as a "redundant, hot-swappable" configuration of frame power modules 502, even if one or more individual frame power modules 502 may fail and/or be removed (e.g., for one or more reasons that may include removing from system 100 frame power module capacity that is no longer needed after a reconfiguration of system 100; replacing a failed or malfunctioning frame power module 502; replacing a frame power module 502 that has an elevated probability of future failure or malfunction based on accumulated in-service time; and/or replacing a frame power module 502 with a frame power module 502 of a different configuration that may desirably have different characteristics such as different functional features, different maximum output current capability, improved reliability, improved efficiency, and/or lower cost), as long as the total number of failed and/or removed frame power modules 502 is not larger than the overprovisioning multiple M, system 100 may advantageously continue to operate without any loss of functional capacity until the failed and/or removed frame power modules 502 may be replaced.

In some embodiments that may include a plurality of frame power modules 502, spanning across one or more frame power units 500 in system 100, with DC outputs wired together in a parallel current sharing configuration that may feed current to one or more electrical loads (e.g., drawer power PCBAs 402) in a shared frame power domain, the plurality of frame power modules 502 may be configured for coordinated control. Such a configuration may include a control system that may adjust dynamically one or more operational parameters in each of the plurality of frame power modules 502, in response to one or more time-varying operational conditions in system 100. This control system may include one or more control components internal to each of the plurality of frame power modules 502, such as control block 540, and/or one or more control components external to the plurality of frame power modules 502. These control components may be interconnected via one or more data communication links.

As one example of coordinated control of the plurality of frame power modules 502, the control system may enable or disable individual frame power modules 502 dynamically in response to changes in instantaneous aggregate current demand from the one or more electrical loads in the shared frame power domain fed by the plurality of frame power modules 502. The control system may include one or more sensors that may be able to measure aggregate current demand. When aggregate current demand is low, the control system may respond by disabling one or more of the plurality of frame power modules 502. When aggregate current demand rises, the control system may respond by re-enabling one or more of these disabled frame power modules 502. This may help to maximize the collective operational energy efficiency of the plurality of frame power modules 502. Each individual frame power module 502 may produce a level of output current that may vary dynamically according to time-varying current demand from the electrical loads connected to one or more electrical outputs of the frame power module 502. This output current level may vary from a minimum of zero, up to the maximum output current capability of the frame power module 502. At each level of output current, some fraction of the input facility power received by the frame power module 502 may be lost as waste heat, instead of being delivered as frame power to the one or more electrical outputs of the frame power module 502. At each level of output current, the operational energy efficiency of the frame power module 502 may be measured as the ratio between total output frame power and total input facility power, expressed as a percentage. Because of input facility power that may be lost as waste heat, this efficiency percentage may be lower than 100% at every level of output current.

In some embodiments, the efficiency percentage may be highest at a specific optimum level L of output current, and lower when output current is either lower than or higher than optimum level L. Accordingly, the control system may be configured to enable or disable individual frame power modules 502 dynamically in response to the time-varying instantaneous aggregate current demand from the one or more electrical loads in the shared frame power domain fed by the plurality of frame power modules 502, such that at each point in time the output current level of each of the individual enabled frame power modules 502, which may approximately equal the total aggregate current demand divided by the total number of enabled frame power modules 502, is as close as possible to optimum level L, thereby helping to maximize the collective operational energy efficiency of the plurality of frame power modules 502.

FIG. 6 shows a front view of an example of a rackmount unit 600 of system 100, in accordance with some embodiments. Some or all of the modules and corresponding module supports that may be installed in system 100 (e.g., drawer modules 104 and corresponding drawer module supports 122) may be designed specifically for installation in a configurable drawer-based computing system such as system 100. In some embodiments, system 100 may additionally include provisions for installing one or more modules that may be designed to conform to one or more mechanical specifications that may be unrelated to configurable drawer-based computing systems.

Examples of such a mechanical specification may include a specification for a "rackmount" module and a corresponding set of rackmount rails that may be configured such that the module may be mounted to the rackmount rails via a set of fasteners (e.g., including bolts, screws, nuts, and/or any other suitable types of fasteners) that may be used to secure the module to the rackmount rails, via a set of mounting holes on rackmount flanges that may extend from the module, and a corresponding set of mounting holes on the rackmount rails.

A document called EIA/ECA-310-E, published by an organization called the Electrical Components Industry Association, may be one of numerous examples of a rackmount specification that defines many specific mechanical characteristics for a rackmount module and corresponding rackmount rails. For example, a rackmount module conforming to EIA/ECA-310-E may have an overall width of 482.6 mm, including rackmount flanges, and an overall height that may be an integer multiple of 44.5 mm, including rackmount flanges. For some applications of a configurable drawer-based computing system such as system 100, it may be advantageous to install in the system one or more modules that may conform to a rackmount specification such as EIA/ECA-310-E. Each such module may perform one or more functions, which may include without limitation any combination of functions related to power, cooling, data generation, data processing, data storage, and/or data networking.

In order to install into system 100 one or more modules designed to conform to one or more mechanical specifications that may be unrelated to configurable drawer-based computing systems, it may be necessary to employ one or more module supports that may be designed specifically to conform to the mechanical specifications of the modules, and to also conform to a common mechanical interface for attaching a module support to the plurality of module support mounting rails 120, as discussed above. For example, module supports designed to enable installation in system 100 of one or more rackmount modules conforming to a rackmount specification such as EIA/ECA-310-E, may include a set of rackmount rails that may conform to the same rackmount specification, such that the mechanical characteristics of the rackmount rails, including the positioning and size of the rackmount rails and the mounting holes in the rackmount rails, may be compatible with the mechanical characteristics of the one or more rackmount modules, including rackmount flanges.

With reference to FIG. 6, system 100 may include one or more rackmount units 600. Rackmount unit 600 may include one or more rackmount module supports, such as rackmount module supports 602 and 604, and one or more rackmount modules, such as rackmount module 610. Rackmount module supports 602 and 604 may each include mechanical elements, such as slide components 606, that may implement a mechanical interface to the plurality of module support mounting rails 120 that may be common across all types of module supports in system 100. As discussed above, this common mechanical interface may enable installation of any module support, including rackmount module supports 602 and 604, at any of multiple mounting locations along the length dimension of the plurality of module support mounting rails 120. This may in turn help to facilitate installation in system 100 of multiple rackmount modules of various heights. Rackmount module supports 602 and 604 may include rackmount rails 608 that may be configured for mounting rackmount flanges of one or more rackmount modules 610 (e.g., via fasteners, including bolts, screws, nuts, and/or any other suitable types of fasteners). In some embodiments, certain mechanical characteristics of rackmount module supports 602 and 604 (e.g., positioning of rackmount rails 608, and/or other mechanical characteristics) may be adjustable (e.g., for one or more purposes that may include accommodating a choice among multiple distinct rackmount specifications for the one or more rackmount modules 610). Any of the one or more rackmount modules 610 may include one or more mechanisms (e.g., sliding rails) that may enable one or more of the one or more rackmount modules 610 to be slidably moved into and out of interior region 114 of frame 102, to help facilitate operations involving the one or more rackmount modules 610 that may include installation, removal, and/or maintenance. In some embodiments, any of the one or more rackmount modules 610 may receive services from one or more of the SDUs, including frame data cable manager 126, frame power distribution unit 128, frame cooling fluid supply manifold 130, and/or frame cooling fluid return manifold 132.

FIGS. 7a and 7b show front and top views, respectively, of an example of a frame heat transfer unit 700 of system 100, in accordance with some embodiments. System 100 may be connected to one or more facility cooling fluid sources (e.g., via fluidic connections made at or near the top and/or bottom of frame 102). If these facility cooling fluid sources can supply facility cooling fluid in a format that may be usable directly by one or more frame cooling fluid supply manifolds 130 and frame cooling fluid return manifolds 132, and by modules in system 100 (e.g., drawer modules 104), then direct fluidic connections may be made between the one or more facility cooling fluid sources and one or more frame cooling fluid supply manifolds 130 and frame cooling fluid return manifolds 132. In this case, it may not be necessary to install any frame heat transfer units 700 in system 100. This may help to reduce capital, operational, and maintenance costs of system 100, and space within frame 102 that would have been occupied by one or more frame heat transfer units 700, may advantageously be used for other purposes (e.g., to install additional drawer modules 104). Otherwise, one or more frame heat transfer units 700 may be installed in system 100, for one or more purposes that may include converting facility cooling fluid from the one or more facility sources into a format that may be usable directly by one or more frame cooling fluid supply manifolds 130 and frame cooling fluid return manifolds 132, and by modules in system 100. The number and type of the one or more frame heat transfer units 700 may be selected based on various criteria, which may include the aggregate maximum total cooling requirement across all of the thermal loads installed in system 100. In a configuration of system 100 that may include multiple frame heat transfer units 700, the set of frame heat transfer units 700 may be either homogeneous or heterogeneous in design and/or configuration.

Frame heat transfer unit 700 may be configured to perform multiple key functions within system 100. A first key function of frame heat transfer unit 700 may be to complete a fully isolated closed-circuit circulation network of frame cooling fluid pathways within system 100, such that frame cooling fluid circulating within this closed-circuit network may not mix with, or otherwise come into direct fluidic contact with, (e.g., external) facility cooling fluid. A second key function of frame heat transfer unit 700 may be to pump frame cooling fluid, thereby forcing circulation of frame cooling fluid within the isolated closed-circuit network of frame cooling fluid pathways within system 100, such that cooled frame cooling fluid may be forced to move away from frame heat transfer unit 700 toward heat sources within system 100 (e.g., within drawer modules 104), and heated frame cooling fluid may be forced to move away from heat sources within system 100 and toward frame heat transfer unit 700. A third key function of frame heat transfer unit 700 may be to receive a flow of cooled facility cooling fluid from a facility cooling fluid supply connection point external to system 100; transfer heat energy within frame heat transfer unit 700 from heated frame cooling fluid to cooled facility cooling fluid, thereby cooling the frame cooling fluid and heating the facility cooling fluid, without allowing direct fluidic contact between frame cooling fluid and facility cooling fluid; and send a flow of heated facility cooling fluid to a facility cooling fluid return connection point external to system 100. A fourth key function of frame heat transfer unit 700 may be to modulate the flow rate of facility cooling fluid within frame heat transfer unit 700, such that if the temperature of cooled frame cooling fluid within system 100 may fall below a minimum acceptable temperature, frame heat transfer unit 700 may reduce the flow rate of facility cooling fluid within frame heat transfer unit 700, thereby reducing the rate of heat transfer from heated frame cooling fluid to cooled facility cooling fluid within frame heat transfer unit 700, and causing the temperature of cooled frame cooling fluid within system 100 to rise to an acceptable level. A fifth key function of frame heat transfer unit 700 may be to provide an enclosed reservoir/accumulator space that may be partially filled with frame cooling fluid and partially filled with air and/or other gases, for purposes which may include helping to maintain a consistent fill level of frame cooling fluid, and helping to absorb pressure transients, in the closed-circuit circulation network of frame cooling fluid pathways within system 100.

As described above, if one or more facility cooling fluid sources can supply facility cooling fluid in a format that may be acceptable for use directly within system 100, it may be possible to configure system 100 without any frame heat transfer units 700. In some embodiments, a facility cooling fluid source may need to meet multiple requirements in order to enable configurations of system 100 without any frame heat transfer units 700. A first example requirement for a facility cooling fluid source may be that the fluid must be compatible with frame cooling fluid pathways within system 100, such that corrosion, erosion, fouling, and/or other types of impairments of or damage to these pathways may not occur at an unacceptably high rate. Examples of incompatible facility cooling fluids may include fluids containing water with excessively high or low pH; fluids containing corrosive chemicals; fluids containing significant levels of inorganic particulates; and fluids containing significant levels of biological contamination. A second example requirement for a facility cooling fluid source may be that the chemical composition of the fluid must provide sufficient thermal performance for use directly within system 100. Examples of facility cooling fluids that may provide insufficient thermal performance for use directly within system 100, may include fluids containing water with additives such as polyethylene glycol that may reduce heat carrying capacity. Such additives may be necessary in facility cooling fluids because of constraints (e.g., protection against freezing) that may apply to facility-scale cooling systems that may be exposed directly to environmental extremes, but may not apply to cooling within system 100, which may be protected against such environmental extremes by the facility itself. A third example requirement for a facility cooling fluid source may be that the temperature of the fluid must be sufficiently regulated, and must not be excessively low. For example, if in any area within system 100 the temperature of cooling fluid falls below the local dew point in that area, damaging condensation may form in that area. A fourth example requirement for a facility cooling fluid source may be that the fluid must be supplied at a pressure that is sufficient to force an adequate rate of cooling fluid flow through the network of frame cooling fluid pathways within system 100, overcoming the pressure drop caused by energy losses as cooling fluid flows through those pathways.

If any of the example requirements listed above for facility cooling fluid sources is not met, the problem may be solved by including one or more frame heat transfer units 700 in a configuration of system 100. By fully isolating frame cooling fluid from facility cooling fluid, a frame heat transfer unit 700 may help to facilitate independent selection and optimization of the compositions of frame cooling fluid and facility cooling fluid, which may be subject to very different sets of design and operational constraints. Isolation of frame cooling fluid within system 100 may also help to facilitate operational control and maintenance of various characteristics of the frame cooling fluid, which may include pH balance, levels of inorganic particulate contamination, and levels of biological contamination. By modulating the flow of facility cooling fluid as described above, a frame heat transfer unit 700 may be able to regulate the temperature of the frame cooling fluid and keep it above the local dew point. Finally, by pumping frame cooling fluid internally within system 100, a frame heat transfer unit 700 may reduce the pumping energy and pressure that a facility cooling fluid source must provide when supplying facility cooling fluid concurrently to more than one frame 102.

Frame heat transfer unit 700 may include one or more frame heat transfer modules 702, and frame heat transfer module support 704. Frame heat transfer module support 704 may include base portion 706 configured to slidably receive and mechanically secure frame heat transfer modules 702 with frame heat transfer module support 704. Frame heat transfer module support 704 may include mechanical elements, such as slide components 708, that may implement a mechanical interface to the plurality of module support mounting rails 120 that may be common across all types of module supports in system 100. As discussed above, this common mechanical interface may enable installation of any module support, including a frame heat transfer module support 704, at any of multiple mounting locations along the length dimension of the plurality of module support mounting rails 120.

With reference to FIG. 7b, in some embodiments frame heat transfer module support 704 may include one or more backplanes 720, for one or more purposes that may include making connections among one or more frame heat transfer modules 702, other parts of system 100, and facilities external to system 100. Such connections may include cooling fluid connections, and may additionally include electrical power connections and/or data connections. Each backplane 720 may include one or more pathways along its length dimension. These may include pathways (e.g., fluidic tubes) for cooling fluid flow; pathways (e.g., electrical conductors) for electrical power flow; and/or pathways (e.g., electrical and/or optical conductors) for data flow. Each such pathway may have a plurality of connection points. In some embodiments, for each frame heat transfer module 702, the one or more backplanes 720 in frame heat transfer module support 704 may collectively provide a set of connection points in the form of one or more backplane blind-mate connectors 722 that may be configured to mate with corresponding module blind-mate connectors 724 on the frame heat transfer module 702, when the frame heat transfer module 702 is slidably inserted into frame heat transfer module support 704. Each mated pair of a backplane blind-mate connector 722 and a module blind-mate connector 724 may establish one or more connections between cooling, power, and/or data pathways in the one or more backplanes 720, and corresponding pathways within the frame heat transfer module 702. The functions of such pathways may include transfer of cooled facility cooling fluid into the frame heat transfer module 702; transfer of heated facility cooling fluid out of the frame heat transfer module 702; transfer of heated frame cooling fluid into the frame heat transfer module 702; transfer of cooled frame cooling fluid out of the frame heat transfer module 702; transfer of frame power into the frame heat transfer module 702; and transfer of data (e.g., for one or more purposes that may include monitoring and/or control) into and out of the frame heat transfer module 702.

Pathways in the one or more backplanes 720 in frame heat transfer module support 704 may include additional connection points, for one or more purposes that may include enabling connections to other parts of system 100 and to facilities external to system 100. Each such connection point may include one or more pluggable connectors, terminal blocks, and/or other suitable connection mechanisms. A backplane 720 may include one or more facility cooling fluid supply tubes, each with one or more facility cooling fluid supply connection points 728 for attachment to one or more external facility cooling fluid supply connections (e.g., via one or more flexible tubes). Similarly, a backplane 720 may include one or more facility cooling fluid return tubes, each with one or more facility cooling fluid return connection points 730 for attachment to one or more external facility cooling fluid return connections. In some embodiments, one or more external facility cooling fluid supply and return connection points may be located at or near the top and/or the bottom of frame 100. A backplane 720 may additionally include one or more frame power conductors, each with one or more frame power inlet connection points 726 for attachment to outlet connection points of one or more frame power distribution units 128 (e.g., via one or more flexible electrical cables). A backplane 720 may include one or more frame cooling fluid supply tubes, each with one or more frame cooling fluid supply connection points 732 for attachment to one or more frame cooling fluid supply manifolds 130 (e.g., via one or more flexible tubes). Similarly, a backplane 720 may include one or more frame cooling fluid return tubes, each with one or more frame cooling fluid return connection points 734 for attachment to one or more frame cooling fluid return manifolds 132. A backplane 720 may additionally include one or more data pathways, each with one or more data connection points 736 for attachment to one or more frame data cable managers 126 (e.g., via one or more flexible cables containing electrical and/or optical conductors).

In some embodiments, the connection points of the one or more backplanes 720 in frame heat transfer module support 704 may be positioned such that when frame heat transfer module support 704 is installed in frame 102, all of these connection points may be disposed toward back side 112 of frame 102, and may not be physically accessible directly via front side 106 of frame 102 during normal operation of system 100. Such positioning of these connection points may advantageously help to minimize the length of the connections (e.g., via flexible tubes and cables) that are needed between backplanes 720 and other connection points both within and external to system 100. Such positioning may also advantageously help to reduce risk of human injuries and/or equipment damage that could occur as a result of body parts, tools, and/or other objects accidentally contacting energized electrical conductors during procedures involving system 100 that may include installation, operation, maintenance, and reconfiguration.

The use of blind-mate connectors 722 and 724 to make connections between backplanes 720 and frame heat transfer modules 702, may enable frame heat transfer modules 702 to be slidably inserted into and removed from frame heat transfer module support 704 without requiring attachment or detachment of any of the connections between backplanes 720 and other connection points within and external to system 100. This may in turn advantageously enable slidable insertion and removal of frame heat transfer module 702 via physical access to only front side 106 of frame 102, without requiring any physical access to left side 108, right side 110, back side 112, top side 116, or bottom side 118 of frame 102.

In some embodiments, a frame heat transfer module 702 may include one or more instances of each of one or more distinct types of internal functional blocks that may collectively implement the functions of frame heat transfer module 702. Examples of these types of functional blocks may include pumping block 738, heat exchange block 740; fluid storage/accumulator block 742, and control block 744. Certain design elements may be common across multiple block types. For example, a block that may require electrical power for its internal operations, may be configured to receive this power from frame power pathways in frame heat transfer module 702. As a second example, a block may be configured to remove internally generated waste heat by receiving cooled frame cooling fluid from a frame cooling fluid supply pathway in frame heat transfer module 702, and returning heated frame cooling fluid to a frame cooling fluid return pathway in frame heat transfer module 702. As a third example, a block may additionally include one or more elements that may use one or more data pathways, including data pathways in frame heat transfer module 702 and data pathways in backplane 720, to communicate with one or more other blocks in frame heat transfer module 702; one or more other frame heat transfer modules 702 and/or modules of other types in system 100; and/or one or more systems external to system 100. Such elements may include controllers, sensors, actuators, and/or elements of other types that may send and/or receive data. As a fourth example, a block may include one or more common fluidic elements such as proportional modulating valves for controlling flow rates and/or pressures, and check valves for enforcing flow direction.

At each of one or more points within a block, one or more sensors may measure time-varying conditions that may include component parameters such as temperature and motor speed; electrical parameters such as voltage, current, AC frequency, and AC waveform characteristics; and cooling fluid parameters such as temperature, pressure, and flow rate. One or more computing elements within system 100 and/or external to system 100 may use data from these sensors to help monitor the health of components within frame heat transfer module 702, and/or the health of the facility source supplying cooling fluid to frame heat transfer module 702. These computing elements may additionally use this health information to perform various automated actions, which may include sending notifications, disabling failing components, adjusting system operational parameters (e.g., to help compensate for component failures), or proactively performing protective orderly shutdowns of healthy components (e.g., after detecting facility cooling fluid source impairments that may be predictive of imminent failure of the facility cooling source).

Pumping block 738 may be configured to receive heated frame cooling fluid from one or more frame cooling fluid return pathways in frame heat transfer module 702, and pump the heated frame cooling fluid via one or more fluid pathways into one or more heat exchange blocks 740. Pumping block 738 may include one or more motor-driven pumps, connected in series and/or parallel configurations. One or more pumps within pumping block 738 may be capable of variable-speed and/or variable-pressure operation.

Heat exchange block 740 may include one or more fluid-to-fluid heat exchanger components (e.g., such as plate type heat exchangers, and/or fluid-to-fluid heat exchangers of one or more other types) that each may include a primary fluid pathway, a secondary fluid pathway, and one or more structures that may transfer heat energy from fluid flowing within the primary fluid pathway, to fluid flowing within the secondary fluid pathway, without allowing any direct fluidic contact between fluid flowing within the primary fluid pathway and fluid flowing within the secondary fluid pathway. Heat exchange block 740 may be configured to receive heated frame cooling fluid via one or more fluid pathways from one or more pumping blocks 738, cool the received frame cooling fluid by passing it through the primary fluid pathway of one or more fluid-to-fluid heat exchangers, and send the cooled frame cooling fluid into one or more frame cooling fluid supply pathways in frame heat transfer module 702. Heat exchange block 740 may further be configured to receive cooled facility cooling fluid from one or more facility cooling fluid supply pathways in frame heat transfer module 702, heat the received facility cooling fluid by passing it through the secondary fluid pathway of one or more fluid-to-fluid heat exchangers, and send the heated facility cooling fluid into one or more facility cooling fluid return pathways in frame heat transfer module 702. One or more proportional modulating valves may be configured within heat exchange block 740 to modulate the flow rate of facility cooling fluid within the secondary fluid pathway of one or more fluid-to-fluid heat exchangers. If the temperature of cooled frame cooling fluid within system 100 may fall below a minimum acceptable temperature, these one or more proportional modulating valves may be used to reduce the flow rate of facility cooling fluid, thereby reducing the rate of heat transfer from frame cooling fluid to facility cooling fluid within the one or more fluid-to-fluid heat exchangers, and causing the temperature of cooled frame cooling fluid within system 100 to rise to an acceptable level, as also described above.

Fluid storage/accumulator block 742 may include one or more fluid containers that each may be closed except for one or more fluidic connections to one or more frame cooling fluid supply and/or return pathways within frame heat transfer module 702. These one or more fluid containers may be filled partially with frame cooling fluid and partially with air and/or other gases, for purposes which may include helping to maintain a consistent fill level of frame cooling fluid, and helping to absorb pressure transients, in the closed-circuit circulation network of frame cooling fluid pathways within system 100, as also described above.

Control block 744 may be configured with computing hardware, firmware, and software designed to help coordinate the operation of one or more frame heat transfer modules 702 within system 100. To help effect this coordination, control block 744 may communicate with other controllers, sensors, actuators, and/or elements of other types within one or more other functional blocks within the same frame heat transfer module 702; one or more other frame heat transfer modules 702 and/or modules of other types within system 100; and/or one or more other systems external to system 100.

In some embodiments, system 100 may be configured for facility cooling fluid source redundancy. In such embodiments, system 100 may have a total of two or more separate and independent facility cooling fluid source connections. In a system 100 that includes one or more frame heat transfer units 700, each facility cooling fluid source connection may be made at a facility cooling fluid supply connection point 728 and a facility cooling fluid return connection point 730 of a backplane 720 of a frame heat transfer module support 704. In a system 100 that does not include any frame heat transfer units 700, each facility cooling fluid source connection may be made at an inlet connection point of a frame cooling fluid supply manifold 130 and an outlet connection point of a frame cooling fluid return manifold 132. Each such connection may be attached to one of a total of two or more separate and independent facility cooling fluid sources. If one or more of these attached facility cooling fluid sources may fail, one or more other attached facility cooling fluid sources may remain operational and may be able to continue to feed facility cooling fluid to system 100. Depending on the specific configuration of the two or more attached facility cooling fluid sources, the specific internal configuration of system 100, and the specific set of failed facility cooling fluid sources, system 100 may be able to continue to operate at either full or partial functional capacity during a failure of one or more (but not all) of the two or more attached facility cooling fluid sources.

In some embodiments, one or more backplanes 720 of frame heat transfer module support 704 may be configured to enable slidable insertion of one or more frame heat transfer modules 702, including engagement of backplane blind-mate connectors 722 and module blind-mate connectors 724, at times when one or more facility cooling fluid supply connection points 728 may be pressurized, and one or more frame power inlet connection points 726 may be energized. This may be referred to herein as "hot-plug" capability for frame heat transfer modules 702, which may require blind-mate connectors 722 and 724 to include specific design characteristics, such as dry-break capability for fluidic connections, and arc-flash prevention and/or suppression for electrical connections. Similarly, in some embodiments, one or more backplanes 720 of frame heat transfer module support 704 may be configured to enable slidable removal of one or more frame heat transfer modules 702, including disengagement of backplane blind-mate connectors 722 and module blind-mate connectors 724, at times when one or more facility cooling fluid supply connection points 728 may be pressurized, and one or more frame power inlet connection points 726 may be energized. This may be referred to herein as "hot-unplug" capability for frame heat transfer modules 702. In some embodiments with hot-plug and hot-unplug capabilities for frame heat transfer modules 702, each frame heat transfer module 702 may be configured to provide one or more fluidic outputs, each at a regulated fixed pressure and at a flow rate that may vary dynamically according to the aggregate of the instantaneous flow rate demands of one or more connected fluidic loads (e.g., one or more cooling rails 312 in one or more drawer modules 104, connected via one or more frame cooling fluid supply manifolds 130 and frame cooling fluid return manifolds 132), up to a maximum output flow rate capability defined by the design of frame heat transfer module 702. Such embodiments may further include "flow sharing" capability, in which corresponding fluidic outputs of a set of two or more frame heat transfer modules 702, spanning across one or more frame heat transfer units 700 in system 100, may be connected together in parallel to feed all of the fluidic loads (e.g., one or more cooling rails 312 in one or more drawer modules 104) in a shared "frame cooling domain", such that each of these two or more frame heat transfer modules 702 may contribute a roughly equal share of the aggregate flow rate demanded by the fluidic loads in the shared frame cooling domain. Such embodiments may advantageously enable resilient configurations of frame heat transfer modules 702 in system 100. As one example of such a resilient configuration of frame heat transfer modules 702 in system 100, multiple identically configured frame heat transfer modules 702 may be connected to feed frame cooling fluid to a shared frame cooling domain, such that the aggregate maximum output flow rate capability across all of these frame heat transfer modules 702 may exceed the maximum aggregate flow rate demand across all of the fluidic loads in the shared frame cooling domain, by an amount that may be greater than or equal to an overprovisioning multiple M of the maximum output flow rate capability of a single frame heat transfer module 702. In such a configuration of frame heat transfer modules 702 in system 100, which may be referred to herein as a "redundant, hot-swappable" configuration of frame heat transfer modules 702, even if one or more individual frame heat transfer modules 702 may fail and/or be removed (e.g., for one or more reasons that may include removing from system 100 frame heat transfer module capacity that is no longer needed after a reconfiguration of system 100; replacing a failed or malfunctioning frame heat transfer module 702; replacing a frame heat transfer module 702 that has an elevated probability of future failure or malfunction based on accumulated in-service time; and/or replacing a frame heat transfer module 702 with a frame heat transfer module 702 of a different configuration that may desirably have different characteristics such as different functional features, different maximum output flow rate capability, improved reliability, improved efficiency, and/or lower cost), as long as the total number of failed and/or removed frame heat transfer modules 702 is not larger than the overprovisioning multiple M, system 100 may advantageously continue to operate without any loss of functional capacity until the failed and/or removed frame heat transfer modules 702 may be replaced.

FIG. 8 shows a flowchart of an example of a method 800 for managing a configurable drawer-based computing system, in accordance with some embodiments. Method 800 may be performed to efficiently accomplish tasks involving modules (e.g., drawer modules 104) of system 100. Such tasks may include, without limitation, installation, repair, replacement, removal, configuration, reconfiguration, troubleshooting, and/or upgrades.

Method 800 may begin at 802 and proceed to 804, where a drawer module support 122 may be disposed within an interior region 114 of frame 102. For example, drawer module support 122 may be adjustably connected with module support mounting rails 120 such that drawer module support 122 may be disposed at a selected mounting location along the length dimension of module support mounting rails 120. Multiple drawer module supports 122 may be adjustably connected with module support mounting rails 120, and each drawer module support 122 may be configured to slidably receive a drawer module 104, as discussed above.

At 806, a drawer module 104 may be slidably connected with the drawer module support 122 via open front side 106 of frame 102. For example, slide components 322 of drawer module 104 may be aligned with the drawer module support 122 via corresponding protrusions and notches, and then slid (e.g., at least partially) into interior region 114 of frame 102. In some embodiments, at 806 drawer module 104 may be inserted only partially within drawer module support 122, such as to provide more space for physical access and maintenance.

At 808, a drawer power PCBA 402 of drawer module 104 may be connected with one or more frame power distribution units 128 of system 100 via one or more frame power cables. For example, the one or more frame power cables may be connected via power cable connectors to each of drawer power PCBA 402 and a frame power distribution unit 128. In some embodiments, a second drawer power PCBA 402 of drawer module 104, such as may be disposed on an opposite cooling plane of heat transfer grid 302, may also be connected with frame power distribution unit 128 via one or more frame power cables. When connected, frame power distribution unit 128 may supply frame power to drawer power PCBA 402, which may then supply drawer power to each of databoard PCBAs 304*a-c* of drawer module 104.

At 810, a drawer network PCBA 404 of drawer module 104 may be connected with one or more frame data cable managers 126 of system 100 via one or more frame data cables. For example, one or more of the frame data cables in a frame data cable manager 126 may be connected via data cable connectors to drawer network PCBA 404. In some embodiments, a second drawer network PCBA 404 of drawer module 104, such as may be disposed on an opposite cooling plane of heat transfer grid 302, may also be connected with frame data cable manager 126 via one or more frame data cables. When connected, frame data cable manager 126 may supply frame data networking to drawer network PCBA 404, which may then supply drawer data networking to each of databoard PCBAs 304*a-c* of drawer module 104. Frame data cable manager manager 126 may additionally or alternatively supply frame data networking directly to one or more of databoard PCBAs 304*a-c* of drawer module 104, via one or more frame data cables that may be connected via data cable connectors directly to one or more of databoard PCBAs 304*a-c*.

At 812, cooling rails 312*a-d* of drawer module 104 may be connected with one or more frame cooling fluid supply manifolds 130 of system 100 via one or more frame cooling fluid supply tubes. For example, the one or more frame cooling fluid supply tubes may be connected via fluid tube connectors to each of a cooling rail 312 and a frame cooling fluid supply manifold 130. In some embodiments, two or more of cooling rails 312*a-d* may share interconnected channels and a single fluid tube connector connected with a frame cooling fluid supply tube. In other embodiments, each of cooling rails 312*a-d* may include a fluid tube connector connected individually with frame cooling fluid supply manifold 130 via separate frame cooling fluid supply tubes. When connected, frame cooling fluid supply manifold 130 may supply cooled frame cooling fluid to drawer module 104, for removal of waste heat from components of drawer module 104, which may include databoard PCBAs 304*a-c*, drawer power PCBA 402, and drawer network PCBA 404.

At 814, cooling rails 312*a-d* of drawer module 104 may be connected with one or more frame cooling fluid return manifolds 132 of system 100 via one or more frame cooling fluid return tubes. For example, the one or more frame cooling fluid return tubes may be connected via fluid tube connectors to each of a cooling rail 312 and a frame cooling fluid return manifold 132. In some embodiments, two or more of cooling rails 312*a-d* may share interconnected channels and a single fluid tube connector connected with a frame cooling fluid return tube. In other embodiments, each of cooling rails 312*a-d* may include a fluid tube connector connected individually with frame cooling fluid return manifold 132 via separate frame cooling fluid return tubes. When connected, frame cooling fluid return manifold 132 may receive heated frame cooling fluid that was received by drawer module 104 as cooled frame cooling fluid from frame cooling fluid supply manifold 130, and then heated by waste heat from components of drawer module 104, which may include databoard PCBAs 304*a-c*, drawer power PCBA 402, and drawer network PCBA 404.

At 816, the frame power cable(s), frame data cable(s), frame cooling fluid supply tube(s), and frame cooling fluid return tube(s) may be secured with a guide arm 412. As discussed above, guide arm 412 may provide for the orderly movement of the cables and tubes (e.g. as drawer module 104 is slid in to or out from interior region 114 of frame 102) together with guide arm 412, without excessive mechanical stresses or requiring any disconnections.

At 818, drawer module 104 may be fully inserted within the drawer module support 122 to interior region 114 of frame 102. Drawer module 104 may rest fully within interior region 114 during normal operation, with networking, power, and cooling supplied by the connected frame data cable manager(s) 126, frame power distribution unit(s) 128, frame cooling fluid supply manifold(s) 130, and frame cooling fluid return manifold(s) 132. If system 100 includes one or more additional drawer modules 104, each such additional drawer module 104 may similarly be inserted as discussed above.

At 820, a determination may be made that drawer module 104 needs to be physically accessed. For example, drawer module 104 may be physically accessed for one or more purposes that may include adding, removing, repairing, reconfiguring, or otherwise maintaining one or more components of drawer module 104, such as PCBAs, frame data connections, frame power connections, or frame cooling fluid connections, and/or other components.

In response to determining to physically access drawer module 104, method 800 may proceed to 822, where drawer module 104 may be at least partially slid out from interior region 114 of frame 102, via front side 106 of frame 102. The frame data cable(s), frame power cable(s), frame cooling fluid supply tube(s), and frame cooling fluid return tube(s) of drawer module 104 may remain connected continuously while drawer module 104 is slid out from, and subsequently back in to, interior region 114, thereby enabling physical access to individual components of drawer module 104 in a manner that does not require the disconnection of any cable or tube connections. Furthermore, properly functioning components of drawer module 104, which may include one or more databoard PCBAs 304 and 306, drawer power PCBAs 402, and drawer network PCBAs 404, may continue to function normally at full operational capacity without interruption, and receive needed power, data, and cooling, while drawer module 104 is slid out from, and subsequently back in to, interior region 114. As discussed above and shown in FIG. 4*b*, when drawer module 104 is slid out from interior region 114, guide arm 412 may extend to provide orderly movement of the cables and tubes in accordance with the movement (e.g., unbending and extension) of guide arm 412.

At 824, one or more components of drawer module 104 may be physically accessed from front side 106 of frame 102, when drawer module 104 is slid out from interior region 114 of frame 102. Physical access to drawer module 104 may be used for various maintenance tasks. Advantageously, databoard PCBAs 304 and 306 on both cooling planes of heat transfer grid 302 may be accessed readily when drawer module 104 is slid out from interior region 114. In some embodiments, when other drawer modules adjacent to the drawer module 104 being accessed are also slid out, the other drawer modules may be fully slid into interior region 114 to provide additional physical space for access to the drawer module 104.

After drawer module 104 has been accessed for any purpose, method 800 may return to 818, where drawer module 104 may again be fully inserted within the drawer module support 122 to interior region 114 of frame 102. As described above, drawer module 104 may remain fully inserted within interior region 114 during (e.g., normal) operation. Returning to 820, in response to determining to not physically access drawer module 104, method 800 may proceed to 826 and end.

In some embodiments, some configurations of system 100 may use only passive cooling and/or forced-convection air cooling for removal of waste heat from all components, and may also not include any air-to-fluid heat exchanger modules 136. In such configurations, cost may be reduced by replacing each heat transfer grid 302 with a simpler structure, as discussed above, and by omitting all infrastructure for fluid cooling, including frame heat transfer units 700, frame cooling fluid supply manifolds 130, frame cooling fluid return manifolds 132, cooling rails 312, and frame cooling fluid tubing.

FIG. 9 shows an overhead floor plan view of an example configuration 900 of multiple configurable drawer-based computing systems 100, in accordance with some embodiments. Every floor plan for a configuration of multiple similar computing systems of any type, may need to satisfy multiple design constraints, including a quantity of empty space adjacent to each computing system that is sufficient to meet key operational requirements, including physical access to components of the computing system, and removal of waste heat from the computing system. In many configurations of multiple computing systems, it may be desirable to minimize the size of the empty space adjacent to each computing system, and thereby maximize the overall space efficiency of the configuration, which may be quantified as the total amount of computing system functional capacity aggregated across all of the computing systems, divided by the total amount of floor space occupied by the configuration, including required empty space adjacent to each computing system.

Many conventional rack-based computing systems may include one or more design characteristics that may tend to reduce the space efficiency of multiple-system configurations. One example of such a design characteristic may be a rack design that requires empty space adjacent to both a front side and an opposite back side, for one or more purposes that may include enabling physical access to internal components, and enabling front-to-back flow of cooling air. A floor plan for multiple rack-based computing systems with this design characteristic may include multiple parallel rows of systems, each row including multiple systems positioned side to side, immediately adjacent to one other. In order to meet the requirement for empty space adjacent to both the front side and the back side of each system, the floor plan may need to include an empty "service aisle" between every adjacent pair of parallel rows of systems. For example, a floor plan including a total of four parallel rows of conventional rack-based computing systems, with three systems positioned side to side immediately adjacent to one another within each row, may also need to include a total of three empty service aisles, located between the parallel rows of systems.

As discussed above, configurable drawer-based computing system 100 may include one or more design characteristics that may enable multiple-system configurations that may be significantly more space efficient relative to comparable configurations of many types of conventional rack-based computing systems. For example, the design of system 100 may enable all necessary physical access to components to be performed exclusively via front side 106 of frame 102, without requiring any physical access to left side 108, right side 110, back side 112, top side 116, or bottom side 118 of frame 102. As a result, for physical access purposes, empty space around system 100 may be required only on front side 106. As a second example, some configurations of system 100 may not include forced-convection air cooling for removal of waste heat from components. As discussed above, other configurations of system 100 may include forced-convection air cooling, with intake of cooling air on front side 106, and exhaust of cooling air on top side 116. As a result, for cooling purposes, empty space around system 100 may be required either not at all, or (for embodiments that may include forced-convection air cooling) only on front side 106 and top side 116.

Because system 100 may not require any empty space on left side 108, right side 110, or back side 112, it may be possible to position multiple systems 100 in a double row, with systems 100 immediately adjacent to one another both side to side and back to back within the double row. The example configuration 900 shown in FIG. 9 includes two such double rows, each with six systems 100, and a single empty service aisle 902 located between the two double rows. As discussed above, in order to provide an equivalent amount of functional capacity, many types of conventional rack-based computing systems may require a configuration occupying significantly more floor space (e.g., a total of four single rows, each with three systems, and a total of three empty service aisles located between the rows).

Many modifications and other embodiments will come to mind to the reader of this document, having the benefit of the teachings presented in the foregoing descriptions and the associated drawings. Therefore, it is to be understood that embodiments and implementations are not to be limited to the specific example embodiments disclosed, and that modifications and other embodiments are intended to be included within the scope of the appended claims.

That which is claimed:

1. A configurable drawer-based computing system, comprising:
    a frame defining an interior region and exterior sides including an open front side;
    a plurality of module support mounting rails connected with the frame; and
    a plurality of drawer units, each drawer unit comprising a drawer module support and a drawer module, wherein the plurality of drawer units comprises:
        a plurality of drawer module supports, each drawer module support disposed within the interior region of the frame and connected with the plurality of module support mounting rails, and each drawer module support configured to receive a drawer module from the open front side; and
        a plurality of drawer modules, each drawer module including:
            a heat transfer grid defining a first cooling plane and a second cooling plane opposite to the first cooling plane, each of the first cooling plane and second cooling plane defining one or more external heat exchange interface regions;
            one or more first printed circuit board assemblies (PCBAs) coupled thermally with the first cooling plane;
            one or more second PCBAs coupled thermally with the second cooling plane;
            one or more first cooling rails coupled thermally with the first cooling plane at an external heat exchange interface of the first cooling plane;
            one or more second cooling rails coupled thermally with the second cooling plane at an external heat exchange interface of the second cooling plane; and
            one or more slide components secured with the heat transfer grid, each slide component configured to slidably engage a drawer module support.

2. The configurable drawer-based computing system of claim 1, wherein each slide component is configured to slidably engage a drawer module support such that the drawer module can be slidably inserted within the interior region of the frame and pulled out from the interior region at the open front side of the frame.

3. The configurable drawer-based computing system of claim 1, wherein:
    each of the first cooling plane and second cooling plane defines one or more component interface regions;
    the one or more first PCBAs are coupled thermally with the first cooling plane at a component interface region of the first cooling plane;
    the one or more second PCBAs coupled thermally with the second cooling plane at a component interface region of the second cooling plane; and
    the heat transfer grid facilitates heat flow from the component interface region of the first cooling plane to the external heat exchange interface region of the first cooling plane, and from the component interface region of the second cooling plane to the external heat exchange interface region of the second cooling plane.

4. The configurable drawer-based computing system of claim 1 further including:
    one or more frame power distribution units connected with the plurality of drawer modules via frame power cables, the one or more frame power distribution units configured to supply frame power to the plurality of drawer modules via the frame power cables;
    one or more frame data cable managers connected with the plurality of drawer modules via frame data cables, the one or more frame data cable managers configured to supply data communication to the plurality of drawer modules via the frame data cables;
    one or more frame cooling fluid supply manifolds connected with the plurality of drawer modules via frame cooling fluid supply tubes, the one or more frame cooling fluid supply manifolds configured to supply cooled frame cooling fluid to the cooling rails of the plurality of drawer modules via the frame cooling fluid supply tubes; and
    one or more frame cooling fluid return manifolds connected with the plurality of drawer modules via frame cooling fluid return tubes, the one or more frame cooling fluid return manifolds configured to receive heated frame cooling fluid from the cooling rails of the plurality of drawer modules via the frame cooling fluid return tubes.

5. The configurable drawer-based computing system of claim 4, wherein each of the plurality of drawer modules further includes a guide arm attached to a drawer module support at a first end and attached to the heat transfer grid at a second end, the guide arm securing one or more frame power cables, one or more frame data cables, one or more frame cooling fluid supply tubes, and one or more frame cooling fluid return tubes connected with the drawer module.

6. The configurable drawer-based computing system of claim 5, wherein each guide arm includes:
    a first portion secured with the one or more frame power cables, the one or more frame data cables, the one or more frame cooling fluid supply tubes, and the one or more frame cooling fluid return tubes;
    a second portion secured with the one or more frame power cables, the one or more frame data cables, the one or more frame cooling fluid supply tubes, and the one or more frame cooling fluid return tubes; and a joint connecting the first portion and the second portion, wherein the first portion and second portion bend with respect to each other via the joint, and wherein each guide arm is configured to:
bend at the joint when the drawer module is inserted within the interior region of the frame; and
unbend at the joint when the drawer module is pulled out of the interior region.

7. The configurable drawer-based computing system of claim 4, wherein each of the plurality of drawer modules can be slidably pulled out of the interior region, and subsequently reinserted within the interior region, without disconnecting any of the one or more frame power cables, frame data cables, frame cooling fluid supply tubes, or frame cooling fluid return tubes connected with the drawer module.

8. The configurable drawer-based computing system of claim 4, wherein each of the plurality of drawer modules further includes one or more drawer power PCBAs disposed on the first cooling plane of the heat transfer grid, each drawer power PCBA connected with one or more frame power distribution units via one or more frame power cables and configured to supply drawer power to the one or more first PCBAs.

9. The configurable drawer-based computing system of claim 4, wherein each of the plurality of drawer modules further includes one or more drawer network PCBAs disposed on the first cooling plane of the heat transfer grid, each drawer network PCBA connected with the frame data cable manager via one or more frame data cables and configured to supply data communication to the one or more first PCBAs.

10. The configurable drawer-based computing system of claim 1, wherein the plurality of drawer module supports is adjustably connected with the module support mounting rails such that each drawer module support can be disposed at one of multiple mounting locations along a length dimension of the plurality of module support mounting rails.

11. The configurable drawer-based computing system of claim 1, wherein each of the plurality of drawer units occupies exclusively a physical space, such that the size of this space projected as a distance along a length dimension of the plurality of module support mounting rails, is an integer multiple of a common unit of mounting distance ("pitch").

12. The configurable drawer-based computing system of claim 1 further including:
one or more frame power distribution units configured to supply frame power to the plurality of drawer modules; and
one or more frame power units, each frame power unit including:
a frame power module support disposed within the interior region of the frame and connected with the plurality of module support mounting rails, the frame power module support configured to receive one or more frame power modules; and
one or more frame power modules secured with the frame power module support, each frame power module configured to receive facility power from a facility power source and supply the frame power to the one or more frame power distribution units.

13. The configurable drawer-based computing system of claim 12, wherein the frame power module support includes a backplane including one or more backplane blind-mate connectors configured to mate with corresponding module blind-mate connectors on the one or more frame power modules when the one or more frame power modules is secured with the frame power module support.

14. The configurable drawer-based computing system of claim 1 further including:
one or more frame cooling fluid supply manifolds configured to supply cooled frame cooling fluid to the cooling rails of the plurality of drawer modules;
one or more frame cooling fluid return manifolds configured to receive heated frame cooling fluid from the cooling rails of the plurality of drawer modules; and
one or more frame heat transfer units, each frame heat transfer unit including:
a frame heat transfer module support disposed within the interior region of the frame and connected with the plurality of module support mounting rails, the frame heat transfer module support configured to receive one or more frame heat transfer modules; and
one or more frame heat transfer modules secured with the frame heat transfer module support, each frame heat transfer module connected with facility cooling fluid supply tubing and facility cooling fluid return tubing, and further connected with the one or more frame cooling fluid supply manifolds and the one or more frame cooling fluid return manifolds, each frame heat transfer module configured to:
receive cooled facility cooling fluid from the facility cooling fluid supply tubing;
receive the heated frame cooling fluid from the one or more frame cooling fluid return manifolds;
cool the received heated frame cooling fluid via transfer of heat to the received facility cooling fluid;
supply the cooled frame cooling fluid to the one or more frame cooling fluid supply manifolds; and
return the heated facility cooling fluid to the facility cooling fluid return tubing.

15. The configurable drawer-based computing system of claim 14, wherein the frame heat transfer module support includes a backplane including one or more backplane blind-mate connectors configured to mate with corresponding module blind-mate connectors on the one or more frame heat transfer modules when the one or more frame heat transfer modules is secured with the frame heat transfer module support.

16. The configurable drawer-based computing system of claim 1 further including one or more rackmount module supports, each rackmount module support disposed within the interior region of the frame and connected with the plurality of module support mounting rails, the rackmount module support including module mounts configured to connect with one or more standard rackmount modules.

17. The configurable drawer-based computing system of claim 1 further including:
one or more exhaust fan modules configured to supply forced-convection cooling air flow from within the interior region of the frame to a top exterior side of the frame; and
one or more air-to-fluid heat exchanger modules mounted adjacent to the one or more exhaust fan modules, the one or more air-to-fluid heat exchanger modules configured to remove heat from the cooling air flow within the interior region of the frame.

18. A method of managing a configurable drawer-based computing system, comprising:
disposing a drawer module support within an interior region defined by a frame of the configurable drawer-based computing system;

slidably connecting a drawer module with the drawer module support via an open front side defined by the frame;

connecting a drawer power PCBA of the drawer module with a frame power distribution unit via one or more frame power cables;

connecting at least one of a drawer network PCBA or a databoard PCBA of the drawer module with a frame data cable manager via one or more frame data cables;

connecting cooling rails of the drawer module with a frame cooling fluid supply manifold via one or more frame cooling fluid supply tubes;

connecting the cooling rails of the drawer module with a frame cooling fluid return manifold via one or more frame cooling fluid return tubes;

securing the one or more frame power cables, the one or more frame data cables, the one or more frame cooling fluid supply tubes, and the one or more frame cooling fluid return tubes with a guide arm of the drawer module; and subsequent to securing the one or more frame power cables, the one or more frame data cables, the one or more frame cooling fluid supply tubes, and the one or more frame cooling fluid return tubes with the guide arm, fully inserting the drawer module within the drawer module support to the interior region defined by the frame.

19. The method of claim 18, further comprising, without disconnecting connections of the one or more frame power cables, the one or more frame data cables, the one or more frame cooling fluid supply tubes, or the one or more frame cooling fluid return tubes, at least partially sliding the drawer module out from the interior region from the front side defined by the frame.

20. The method of claim 18, wherein at least partially sliding the drawer module out from the interior region includes unbending the guide arm and the one or more frame power cables, the one or more frame data cables, the one or more frame cooling fluid supply tubes, and the one or more frame cooling fluid return tubes secured with the guide arm.

21. The method of claim 18, wherein fully inserting the drawer module within the drawer module support to the interior region includes bending the guide arm and the one or more frame power cables, the one or more frame data cables, the one or more frame cooling fluid supply tubes, and the one or more frame cooling fluid return tubes secured with the guide arm.

22. The method of claim 18, wherein disposing the drawer module support within an interior region of the frame includes connecting the drawer module support with a plurality of module support mounting rails at a location along a length dimension of the plurality of module support mounting rails, such that the drawer module support is adjustably connected at the location with the plurality of module support mounting rails.

23. The method of claim 18, wherein slidably connecting the drawer module with the drawer module support includes interfacing slide components of the drawer module with the drawer module support.

* * * * *